(12) United States Patent
Dedic et al.

(10) Patent No.: US 8,637,999 B2
(45) Date of Patent: Jan. 28, 2014

(54) LOW-NOISE FLIP-CHIP PACKAGES AND FLIP CHIPS THEREOF

(75) Inventors: Ian Juso Dedic, Northolt Middlesex (GB); Ghazanfer Ali, Reading Berkshire (GB)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/566,581

(22) Filed: Aug. 3, 2012

(65) Prior Publication Data

US 2012/0326335 A1  Dec. 27, 2012

Related U.S. Application Data

(62) Division of application No. 13/434,473, filed on Mar. 29, 2012, which is a division of application No. 12/180,212, filed on Jul. 25, 2008, now Pat. No. 8,178,979.

(30) Foreign Application Priority Data

Jul. 27, 2007  (EP) .................................. 07113378

(51) Int. Cl.
  *H01L 23/48*  (2006.01)
  *H01L 23/52*  (2006.01)
  *H01L 29/40*  (2006.01)

(52) U.S. Cl.
  USPC ........................................................ 257/778

(58) Field of Classification Search
  USPC ........................................................ 257/778
  See application file for complete search history.

(56) References Cited

U.S. PATENT DOCUMENTS

| 6,121,827 A | 9/2000 | Khoini-Poorfard et al. |
| 8,178,979 B2 * | 5/2012 | Dedic et al. .................. 257/778 |
| 2002/0156538 A1 | 10/2002 | Chang |
| 2012/0187579 A1 * | 7/2012 | Dedic et al. .................. 257/778 |

FOREIGN PATENT DOCUMENTS

GB  2 228 381 A  8/1990

OTHER PUBLICATIONS

Paul Van Zeijl et al., "A Bluetooth Radio in 0.18-μm CMOS", IEEE Journal of Solid-State Circuits, Dec. 2002, pp. 1679-1687, vol. 37, No. 12.

* cited by examiner

*Primary Examiner* — Luan Thai
(74) *Attorney, Agent, or Firm* — Arent Fox LLP

(57) ABSTRACT

A low-noise flip-chip package, comprising: a carrier substrate having first and second opposing main faces; and a flip-chip substrate connected in a face-down manner onto the first main face of the carrier substrate via a connection array, wherein: the flip-chip substrate comprises at least first and second circuitry portions spaced apart from one another; the flip-chip substrate comprises a substrate-contact boundary located between the first and second circuitry portions; and each of the first circuitry portion, the second circuitry portion and the substrate-contact boundary has its own separate signal-reference connection extending via a respective connection of the connection array through the carrier substrate to a respective electrical contact at the second main face of the carrier substrate for connection to a common signal-reference element in an external circuit.

7 Claims, 20 Drawing Sheets

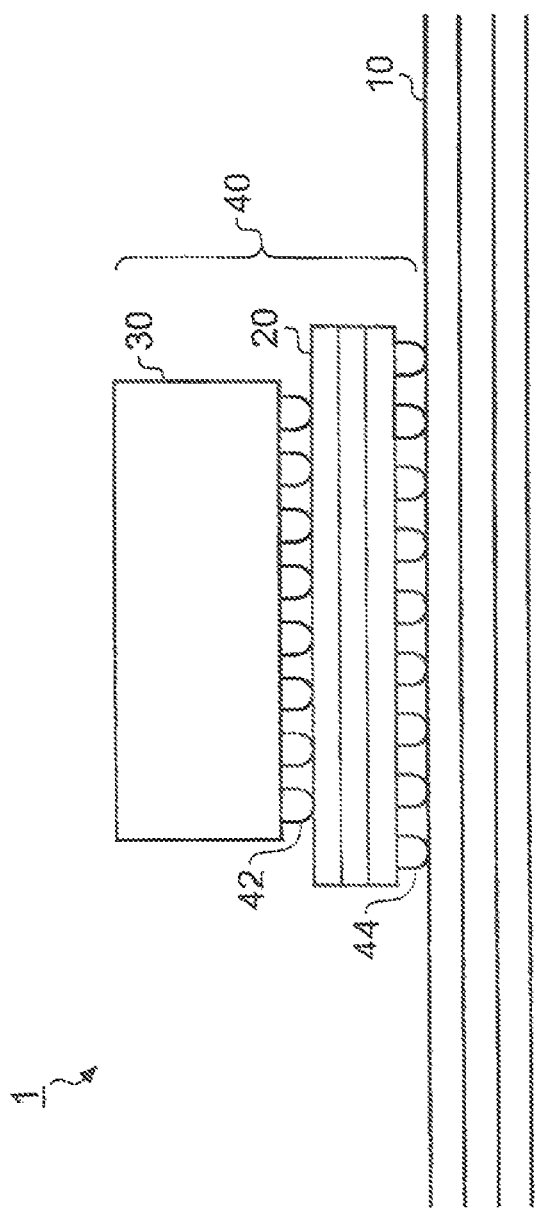

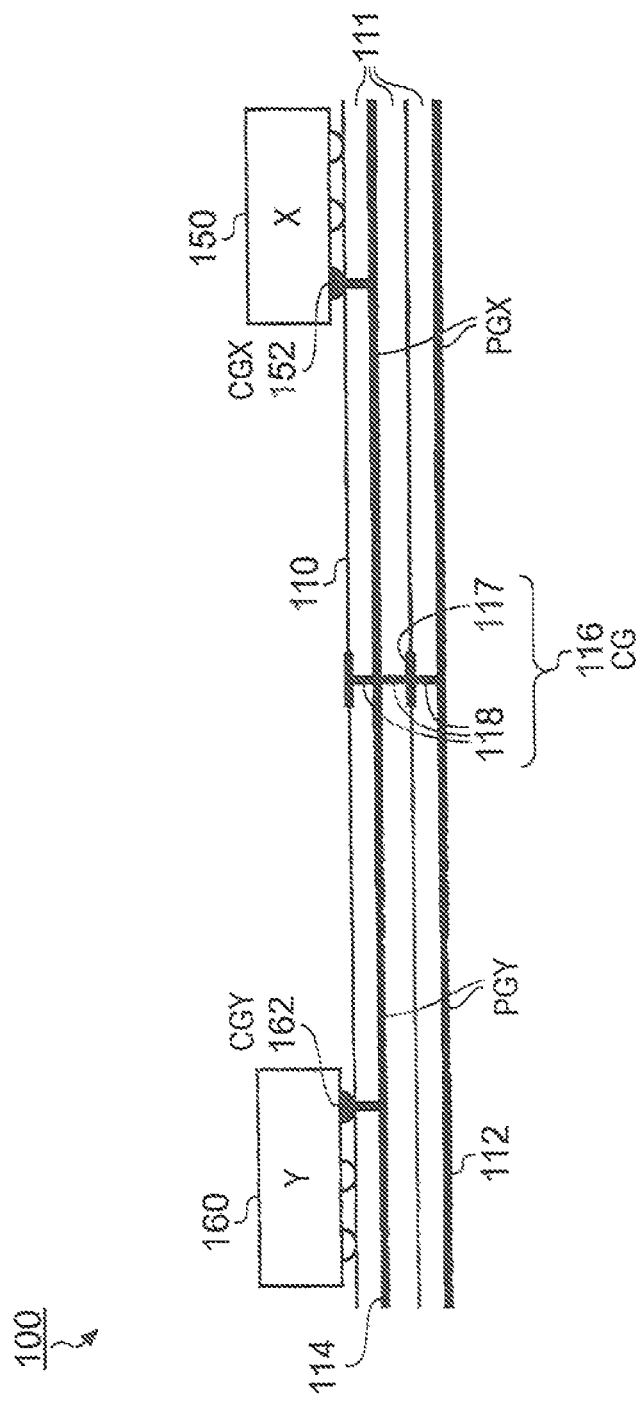

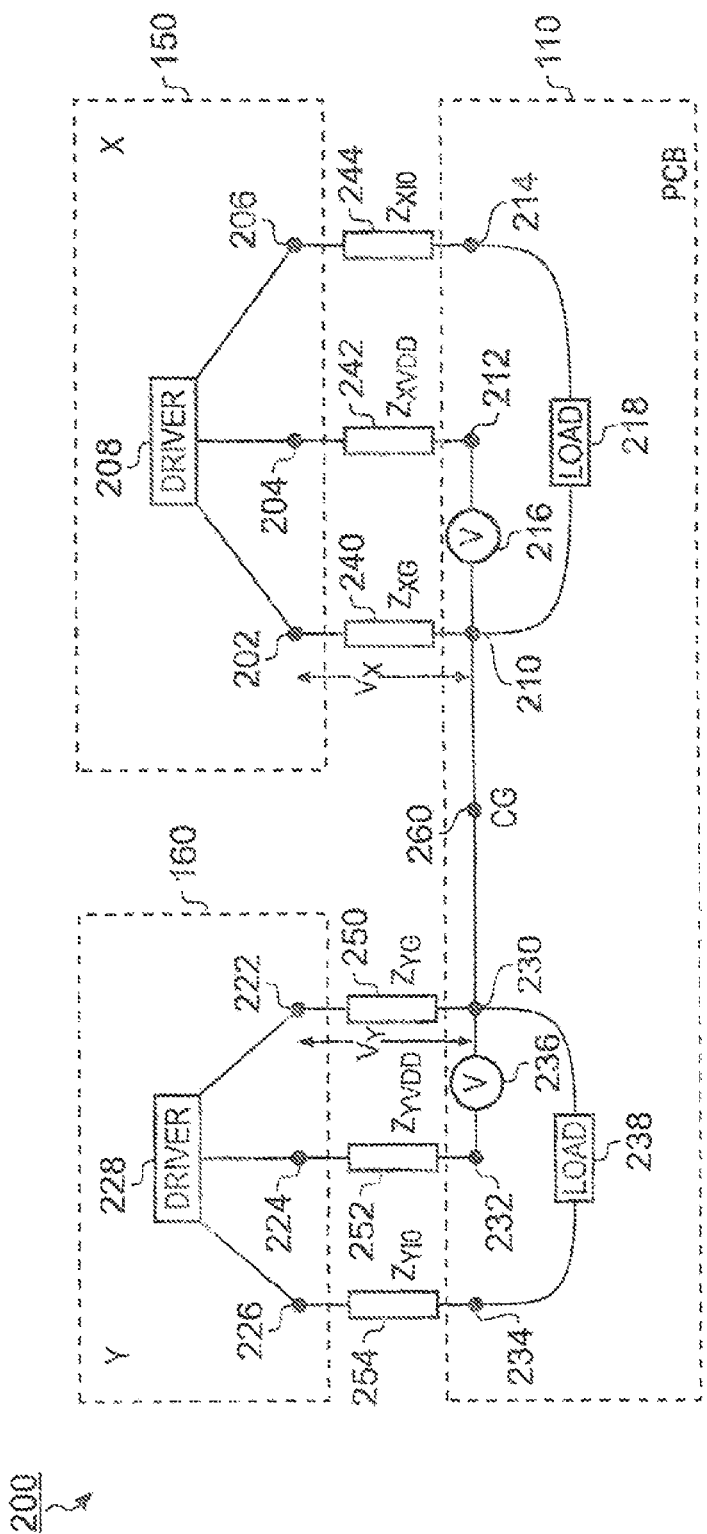
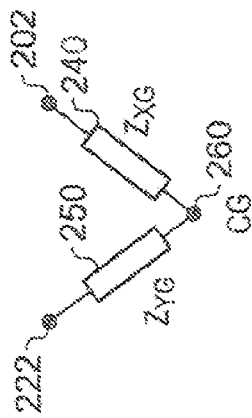
FIG. 3A
FIG. 3B

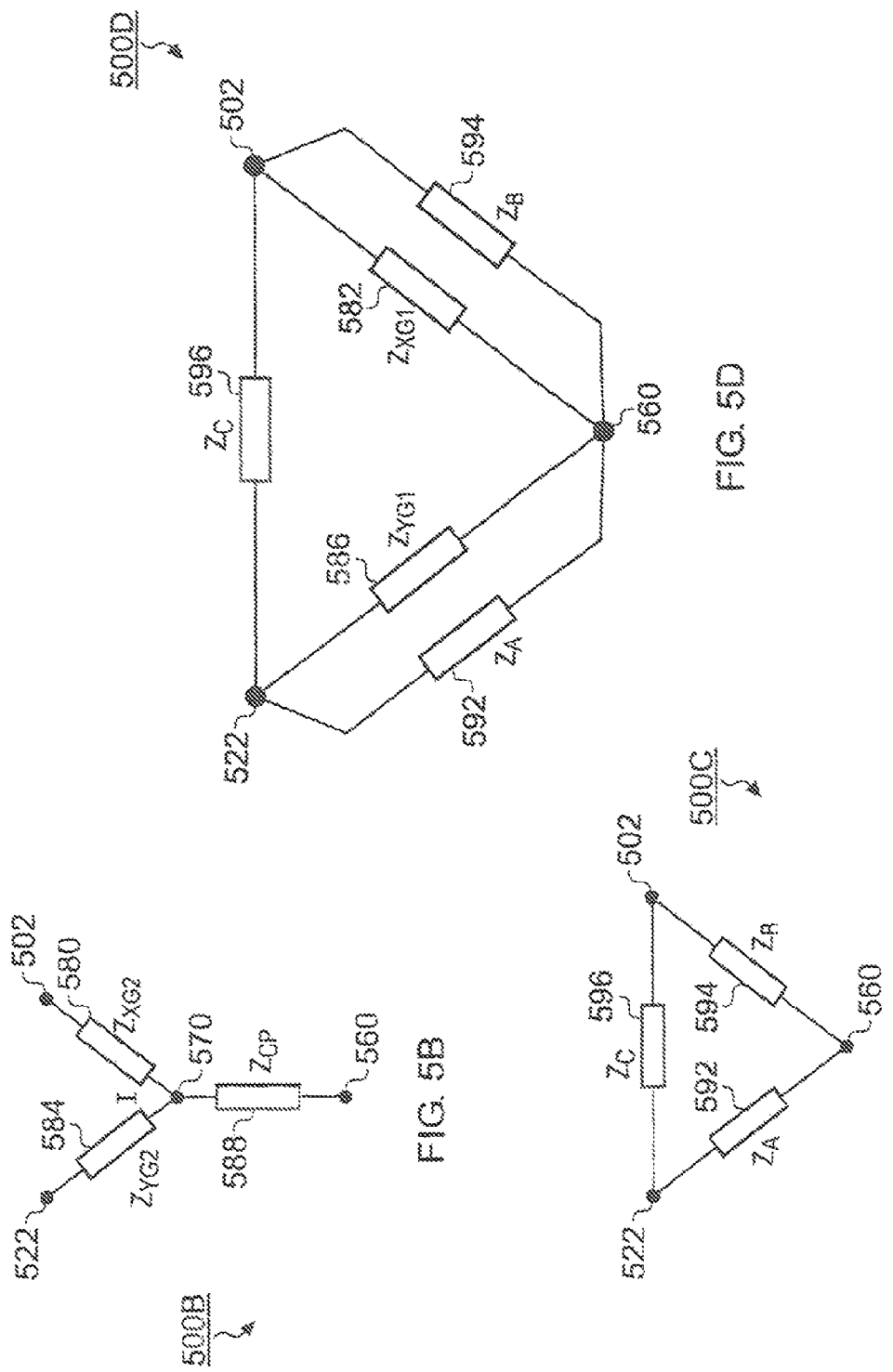

LOW-NOISE FLIP-CHIP PACKAGES AND FLIP CHIPS THEREOF

CROSS-REFERENCED TO RELATED APPLICATIONS

This is a Divisional application Ser. No. 13/434,473, filed Mar. 29, 2012, which is a Divisional of U.S. patent application Ser. No. 12/180,212, filed Jul. 25, 2008, which claims priority to European Patent Application No. 07113378.9, filed Jul. 27, 2007. These prior applications are hereby incorporated by reference herein in their entirety.

The present invention relates to flip-chip packages and flip chips, in particular to such flip-chip packages and flip chips in which an effect of noise on operational performance is substantially reduced.

In general terms, electronic noise manifests itself as an unwanted signal characteristic. Noise represents a fundamental limit in many electronic applications, particularly in signal-processing applications. As such, noise performance is a key consideration for many electronic designs. The rise in high-speed data communications has led to a demand for ever-increasing information densities. Improvements in semiconductor processors has enabled greater data-processing speeds and functional densities to be realised, however this in turn has led to reductions in operating supply voltage and, consequently, in signal amplitude. There is therefore an increasing need to manage noise performance in system design.

It has become possible to provide two or more circuitry portions on flip chips of flip-chip packages. Such circuitry portions may include a noise-generating circuitry portion, and a noise-sensitive circuitry portion. For example, a high-speed digital circuit may form such a noise-generating circuitry portion, and an analogue circuit may form such a noise-sensitive circuitry portion. Accordingly, it is desirable to reduce the effect of noise generated by such a noise-generating circuitry portion on the operation of such a noise-sensitive circuitry portion.

A paper entitled "A Bluetooth Radio in 0.18 µm CMOS", by Paul van Zeijl et al, IEEE Journal of Solid-State Circuits, vol. 37, No. 12, December 2002, discloses an implementation of a Bluetooth radio in a 0.18 µm CMOS process. The radio operates on the same die as baseband, posing a crosstalk-on-silicon issue. In the chip layout, a p-type wall isolates the radio from the baseband. The wall shorts interference to the ground connection in the package.

According to an embodiment of a first aspect of the present invention, there is provided a low-noise flip-chip package, comprising: a carrier substrate having first and second opposing main faces; and a flip-chip substrate connected in a face-down manner onto the first main face of the carrier substrate via a connection array, wherein: the flip-chip substrate comprises at least first and second circuitry portions spaced apart from one another; the flip-chip substrate comprises a substrate-contact boundary located between the first and second circuitry portions; and each of the first circuitry portion, the second circuitry portion and the substrate-contact boundary has its own separate signal-reference connection extending via a respective connection of the connection array through the carrier substrate to a respective electrical contact at the second main face of the carrier substrate for connection to a common signal-reference element in an external circuit.

By providing such a substrate-contact boundary with its own such signal-reference connection, a low impedance (or inductance) connection to such a common signal-reference element is provided to enable a significant proportion of noise currents that would otherwise couple from one circuitry portion to the other to be efficiently collected or picked up (by the substrate-contact boundary). This arrangement reduces common impedance between the two circuitry portions such that noise currents are retained in "self-contained" loops. In this way, it is possible to afford a high degree of noise isolation between the two circuitry portions, thereby reducing the design burden in respect of the integration of the two circuitry portions from the point of view of noise performance. By using a flip-chip package of this design, fewer problems related to noise coupling from one circuitry portion to the other will arise, thus facilitating the task of bringing such a flip-chip package to market.

The signal-reference connections may be ground supply connections, for example when the circuitry of the two portions is implemented in CMOS. It is however envisaged that the present invention could be embodied in a case where emitter-coupled logic (ECL) is employed, in which case the signal-reference connections may be positive-supply connections rather than negative-supply (such as ground) connections.

The common signal-reference element may for example be a common ground supply in the external circuit, to which all ground-supply connections (signal-reference connections) are connected from the flip-chip package. The substrate-contact boundary may be made up of one or more substrate contacts, individually or collectively forming a boundary (for example a wall, or shield) between the two circuitry portions. The boundary is preferably a continuous boundary, but may for example be a broken (or dashed-line) boundary. The boundary (or substrate contacts of the boundary) may have a uniform, or substantially uniform, width. Alternatively, the width may vary along the boundary, for example to give greater noise isolation at certain points along the boundary than at other such points.

Preferably, the signal-reference connection of the substrate-contact boundary forms a boundary extending via a plurality of connections of the connection array through the carrier substrate to a plurality of electrical contacts at the second main face of the carrier substrate for connection to the common signal-reference element. This is advantageous from the point of view of providing a low impedance connection to ground (common signal-reference element) from the substrate-contact boundary. This signal-reference connection for example may form a solid wall (preferably perpendicular to the main faces of the carrier substrate) connecting to the underside of the substrate-contact boundary and passing down through the carrier substrate. This signal-reference connection may alternatively be made up of an arrangement of interconnected columns forming a so-called "picket fence" structure passing down through the carrier substrate. Such structures act as shields to noise, and form low impedance connections. Low impedance connections are desirable from the point of view of efficiently picking up noise that would otherwise be coupled between the two circuitry portions.

Each of the first circuitry portion and the second circuitry portion may have its own separate power-supply connection extending via a respective connection of the connection array through the carrier substrate to a respective electrical contact at the second main face of the carrier substrate for connection to a corresponding power supply in an external circuit. In the case that the signal-reference connections are negative-supply connections (i.e. ground-supply connections), the power-supply connections may be positive-supply connections (e.g. VDD connections). It will be appreciated that the reverse may be true, for example when ECL circuitry is employed as mentioned above.

The substrate-contact boundary may comprise a single substrate contact, or at least two substrate contacts. In the latter case, considering that the first and second circuitry portions may be spaced apart from one another in a separation direction, the substrate contacts of the substrate-contact boundary are preferably also spaced apart from one another in the separation direction. Accordingly, the substrate-contact boundary may be considered a multi-layer boundary, for example comprising a set of parallel boundaries.

At least one substrate contact of the substrate-contact boundary may have its own signal-reference connection extending separately from the other said signal-reference connections via a connection of the connection array through the carrier substrate to a respective electrical contact at the second main face of the carrier substrate for connection to said common signal-reference element. Preferably, however, each substrate contact of the substrate-contact boundary has its own signal-reference connection extending separately from the other said signal-reference connections via a connection of the connection array through the carrier substrate to a respective electrical contact at the second main face of the carrier substrate for connection to said common signal-reference element. This may enable, for example, a substantial amount of noise that may otherwise be coupled from one circuitry portion to the other to be efficiently picked up by a first substrate contact of the substrate-contact boundary, and any remaining amounts of such noise to be picked up in successively reducing amounts by the or each other substrate contact in turn in order from the noise-generating one of the circuitry portions to the other circuitry portion.

Preferably, the signal-reference connection of each substrate contact forms a boundary extending via a plurality of connections of the connection array through the carrier substrate to a plurality of electrical contacts at the second main face of the carrier substrate for connection to the common signal-reference element. Such connections may be solid or "picket-fence" connections as discussed above. Such connections may be perpendicular to the main faces of the carrier substrate, or may take a less direct route through the carrier substrate. The more direct the route, the lower the impedance (or inductance) of the route.

The first and second circuitry portions may be spaced apart from one another in a separation direction, and the flip-chip substrate may have a thickness T. In that case, the or each of said substrate contacts may have a width W in the separation direction, where the or one of the widths W, or a combination C of the widths W, is large enough compared to the thickness T such that in use the substrate-contact boundary provides substantial noise isolation between said circuitry portions. Preferably, W or C≥T, and more preferably W or C≥2T, and more preferably W or C≥4T.

The or each of said substrate contacts is preferably generally elongate so as to form a wall, shield, border or ridge between said circuitry portions. One of the first and second circuitry portions may be an analogue circuitry portion, and the other one of the circuitry portions may be a digital circuitry portion.

It will be appreciated that the present invention may of course extend to the case where there are three or more such circuitry portions provided in the flip-chip substrate, each "separated" from the others by such a substrate-contact boundary. A single such boundary may separate the circuitry portions, or a plurality of such boundaries may be provided.

According to an embodiment of a second aspect of the present invention, there is provided a low-noise flip chip, comprising: a substrate having a thickness T; and first and second circuitry portions formed in said substrate, wherein: the first and second circuitry portions are spaced apart from one another in a separation direction; a substrate-contact boundary is formed in the substrate between the first and second circuitry portions; and the substrate-contact boundary comprises a substrate contact having a width W in the separation direction large enough compared to the thickness T such that in use the substrate-contact boundary provides substantial noise isolation between said circuitry portions.

Such an arrangement may enable the substrate contact of the substrate-contact boundary together with the substrate to act, when the flip chip is in use, as an effective resistive attenuator thereby causing the substrate contact to efficiently pick up noise that would otherwise couple between the circuitry portions.

Preferably W≥T, and more preferably W≥2T, and more preferably W≥4T. It has been found that by the time W≥4T the benefit of the resistive-attenuator effect has largely been had.

The substrate contact may be a first substrate contact, and the width W may be a width W1. The substrate-contact boundary may comprise a second substrate contact formed in the substrate between the first and second circuitry portions, the second substrate contact having a width W2 in the separation direction. In that case, a combination C of said widths W1 and W2 is preferably large enough compared to the thickness T such that in use the substrate-contact boundary provides substantial noise isolation between said circuitry portions.

Preferably C≥T, and more preferably C≥2T, and more preferably C≥4T. Again, it has been found that by the time C≥4T the benefit of the resistive-attenuator effect has largely been had.

The first and second substrate contacts may be spaced apart from one another in the separation direction. Thus, the substrate-contact boundary may be a multi-layer boundary. The first and second substrate contacts may be spaced apart from one another in the separation direction by a separation width SW which is substantially small as compared to a sum of widths W1 and W2. That is, the substrate-contact boundary may be mostly made up of substrate contacts, rather than space between such contacts. The width W1 may be substantially the same as the width W2.

The or both of the substrate contacts (or each of the contacts if more than two are provided) may be generally elongate so as to form a wall, shield, border, or ridge between said circuitry portions.

Again, it will be appreciated that the present invention may of course extend to the case where there are three or more such circuitry portions provided in the substrate, each "separated" from the others by such a substrate-contact boundary. A single such boundary may separate the circuitry portions, or a plurality of such boundaries may be provided.

According to an embodiment of a third aspect of the present invention, there is provided a low-noise flip chip, comprising: a substrate; and first and second circuitry portions formed in said substrate, wherein: the first and second circuitry portions are spaced apart from one another in a separation direction; and a substrate-contact boundary comprising at least two substrate contacts is formed in the substrate between the first and second circuitry portions such that said two substrate contacts are spaced apart from one another in said separation direction.

It has been found that the provision of at least two substrate contacts to form a multi-layer boundary between the circuitry portions provides surprisingly better noise isolation between those circuitry portions than a single such contact, as discussed in greater detail later.

The substrate may have a thickness T, a first one of said substrate contacts may have a width W1 in the separation direction, and a second one of said substrate contacts may have a width W2 in the separation direction. A combination C of said widths W1 and W2 in that case is preferably large enough compared to the thickness T such that in use the substrate-contact boundary provides substantial noise isolation between said circuitry portions. This arrangement provides the benefits of a resistive attenuator as discussed above.

Preferably C≥T, and more preferably C≥2T, and more preferably C≥4T. Again, it has been found that by the time C≥4T the benefit of the resistive-attenuator effect has largely been had.

Preferably, the first and second substrate contacts are spaced apart from one another in the separation direction by a separation width SW that is substantially small as compared to a sum of widths W1 and W2. That is, the substrate-contact boundary may be mostly made up of substrate contacts, rather than space between such contacts. The width W1 may be substantially the same as the width W2.

Preferably one or both of said substrate contacts are generally elongate so as to form a wall (ridge/shield/border) between said circuitry portions.

Again, it will be appreciated that the present invention may of course extend to the case where there are three or more such circuitry portions provided in the substrate, each "separated" from the others by such a substrate-contact boundary. A single such boundary may separate the circuitry portions, or a plurality of such boundaries may be provided.

It is envisaged that embodiments of the present invention may be employed to provide mixed-signal circuits, for example comprising digital and analogue portions, such as digital-to-analog (digital-to-analogue) converters (DACs), either alone or integrated with other (digital or analogue) circuits. Accordingly, the present invention extends to mixed-signal circuits provided on a flip-chip package according to the aforementioned first aspect of the present invention, or on a flip chip according to the aforementioned second or third aspect of the present invention. The present invention equally extends to a digital-to-analogue converter provided on a flip-chip package according to the aforementioned first aspect of the present invention, or on a flip chip according to the aforementioned second or third aspect of the present invention. Such digital-to-analogue converters may be 12 GSa/s converters. Such digital-to-analogue converters may be part of an RF transmitter. The present invention therefore equally extends to an RF transmitter provided on a flip-chip package according to the aforementioned first aspect of the present invention, or on a flip chip according to the aforementioned second or third aspect of the present invention. Such RF transmitters may be part of a base station, relay station, or a mobile device, and thus the present invention extends to that equipment too. Preferable features of one aspect apply to the other aspects.

Reference will now be made, by way of example, to the accompanying drawings, of which:

FIG. 1 is a schematic diagram of a circuitry arrangement 1;

FIG. 2 is a schematic diagram of a circuitry arrangement 100;

FIG. 3A is a schematic diagram 200 of a circuitry representation of the circuitry arrangement 100;

FIG. 3B is a reduced schematic diagram 300 which represents relevant parts of FIG. 3A;

Figure 6:
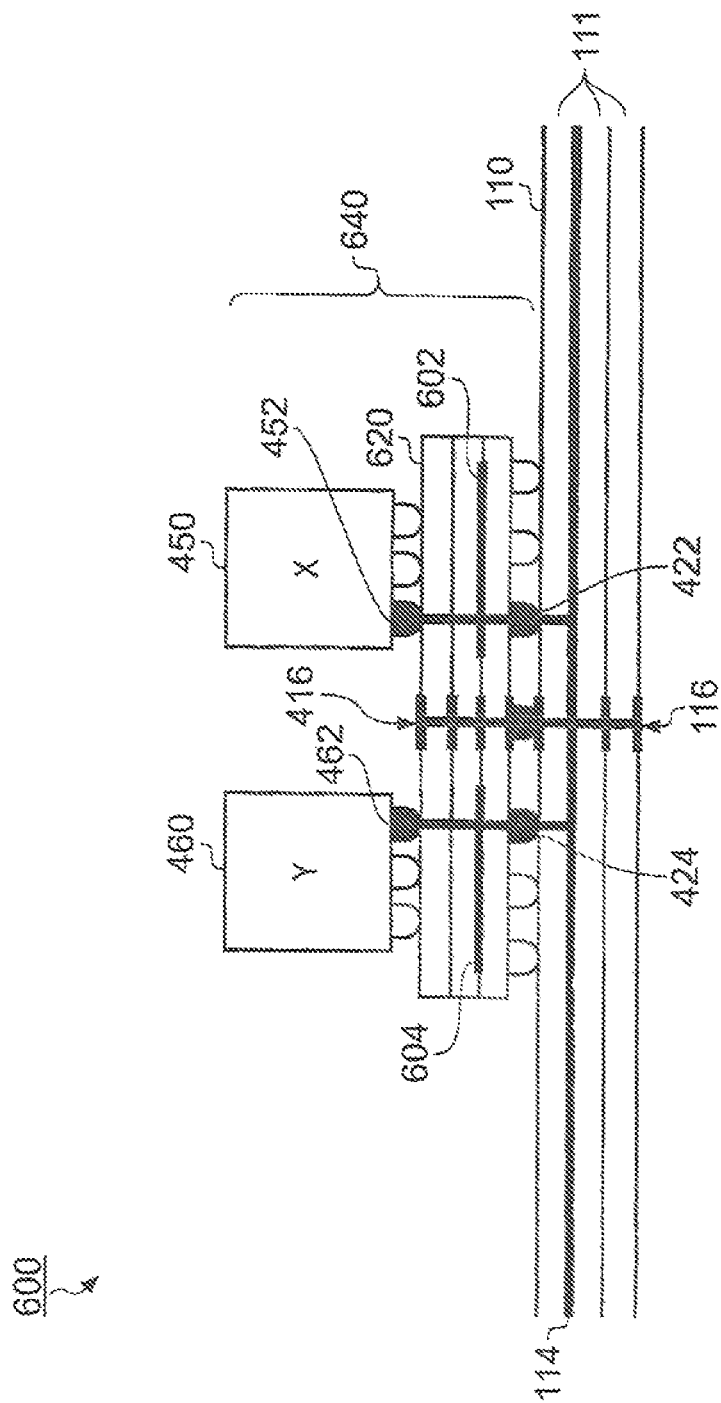
Figure 7:
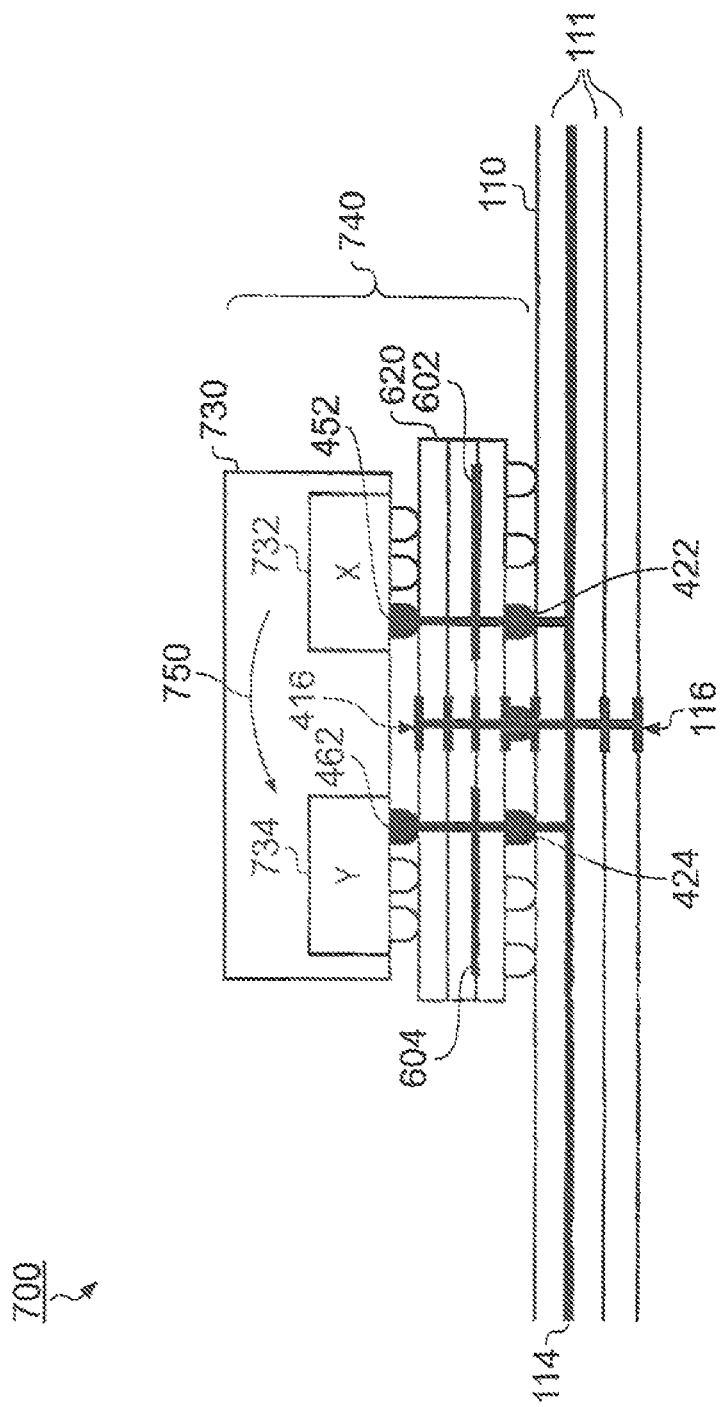
Figure 8:
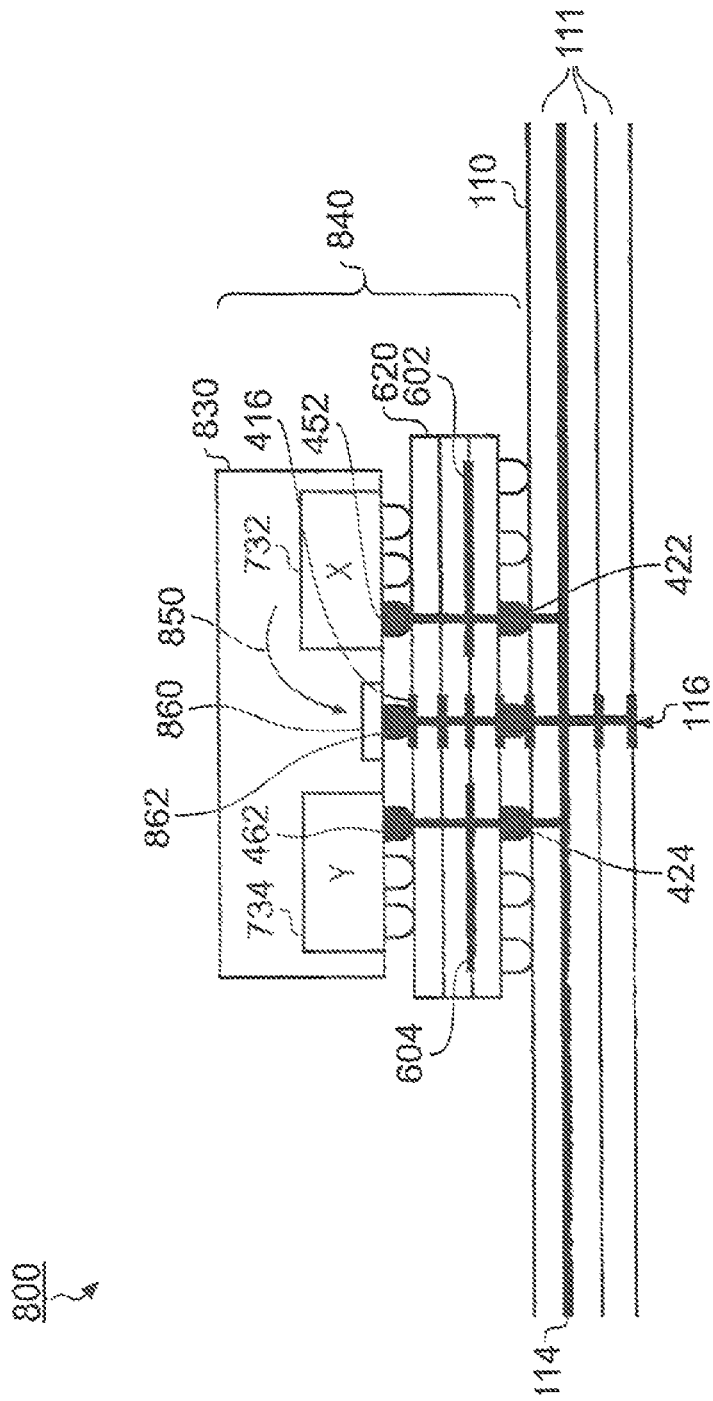
Figure 9:
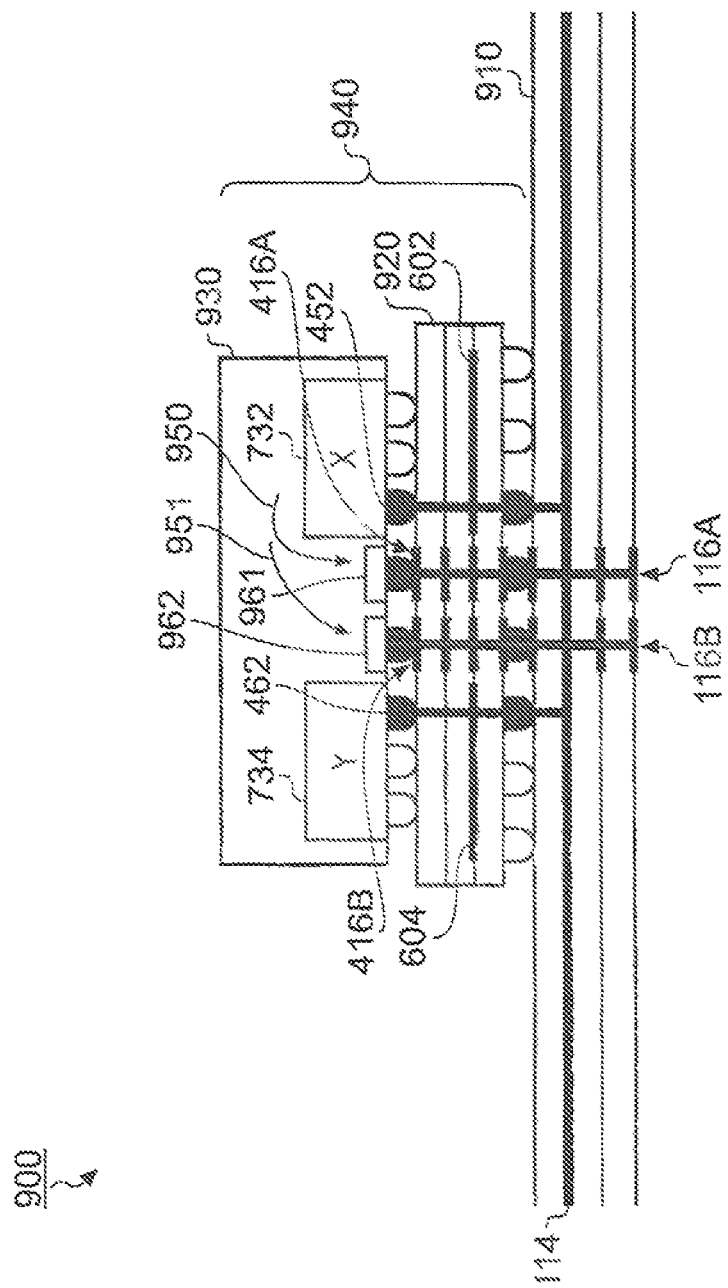
Figure 10:
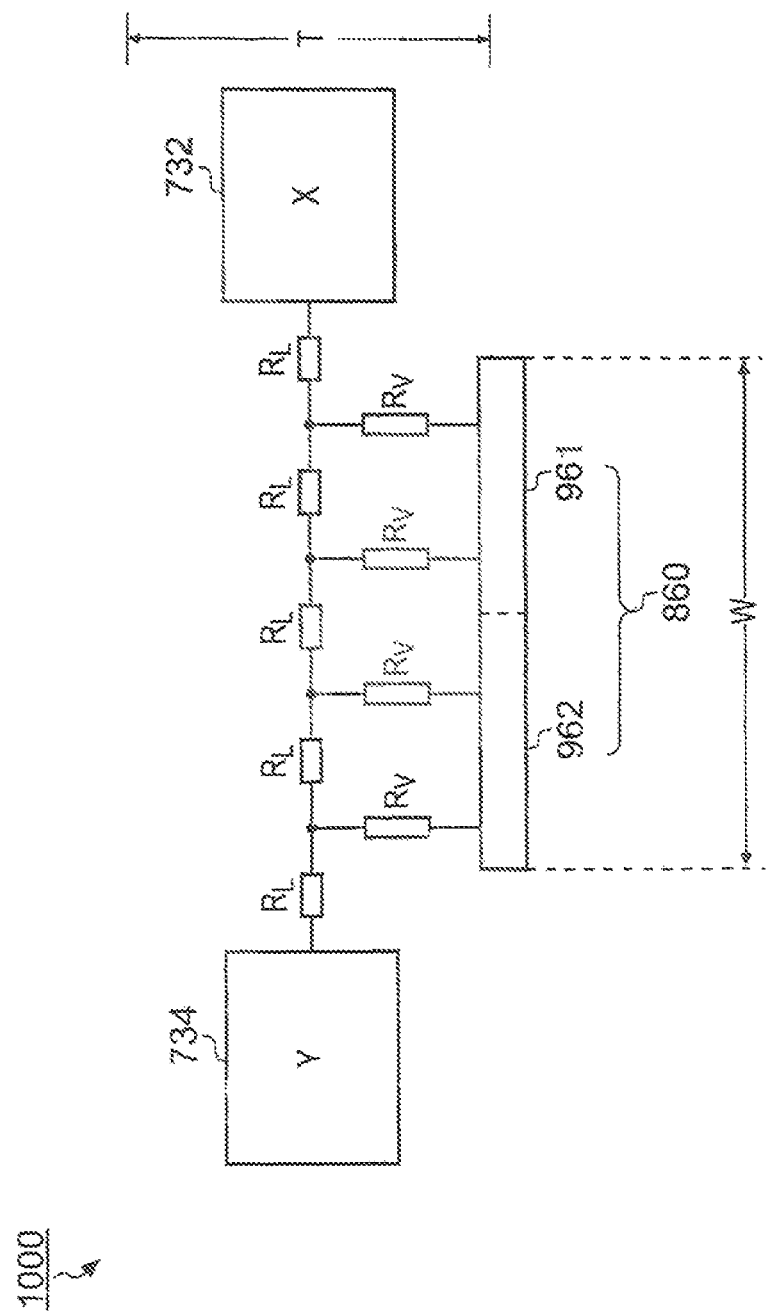
Figure 11:
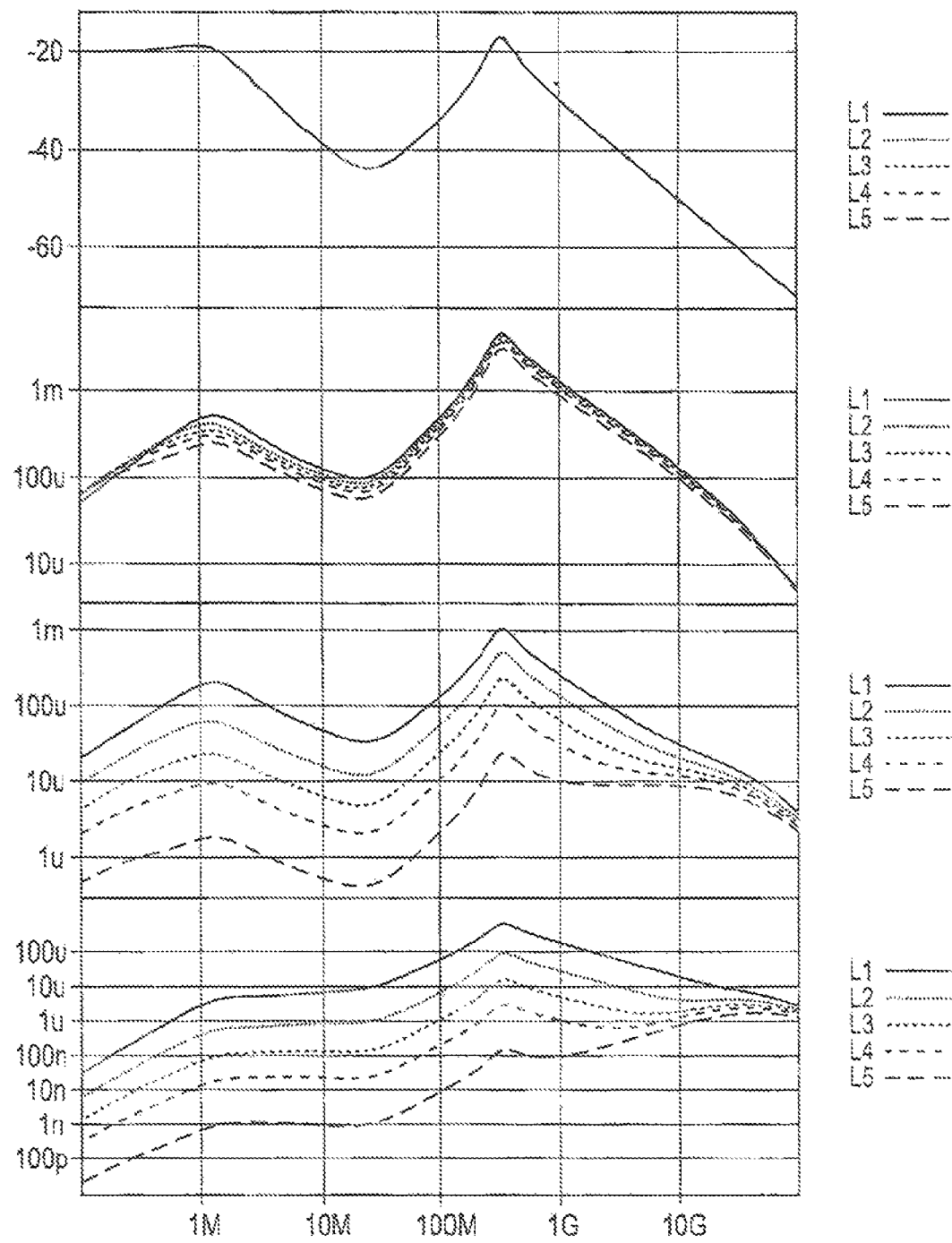
Figure 12A:
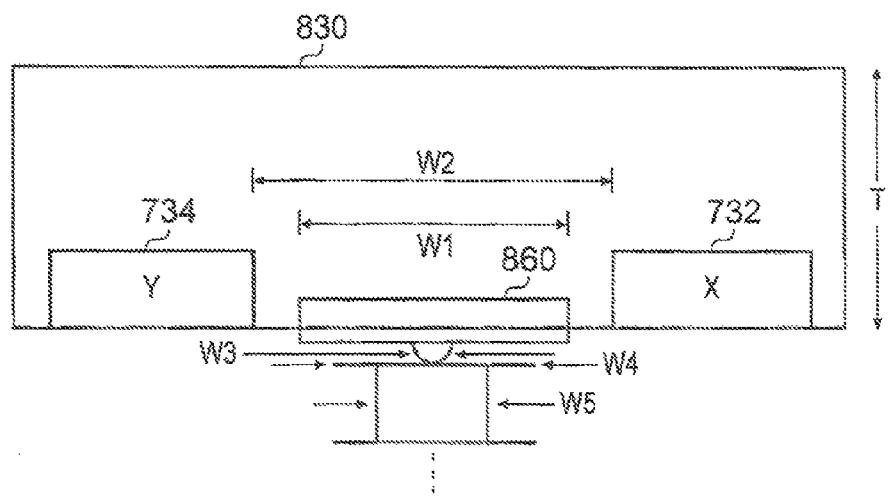
Figure 12B:
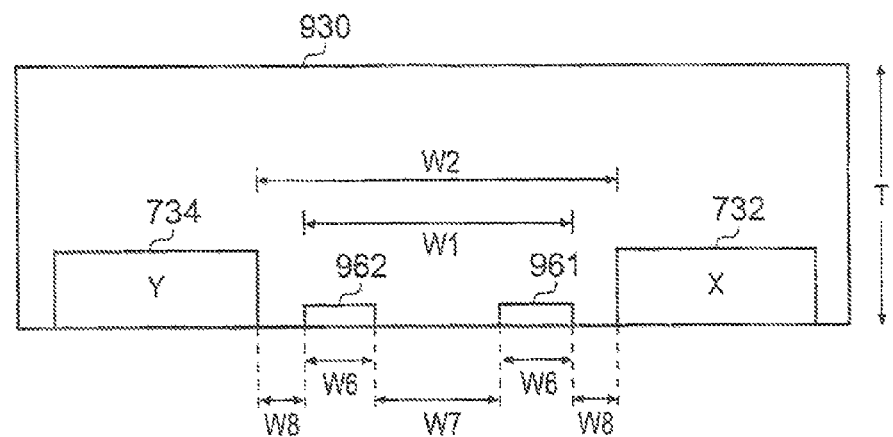
Figure 13:
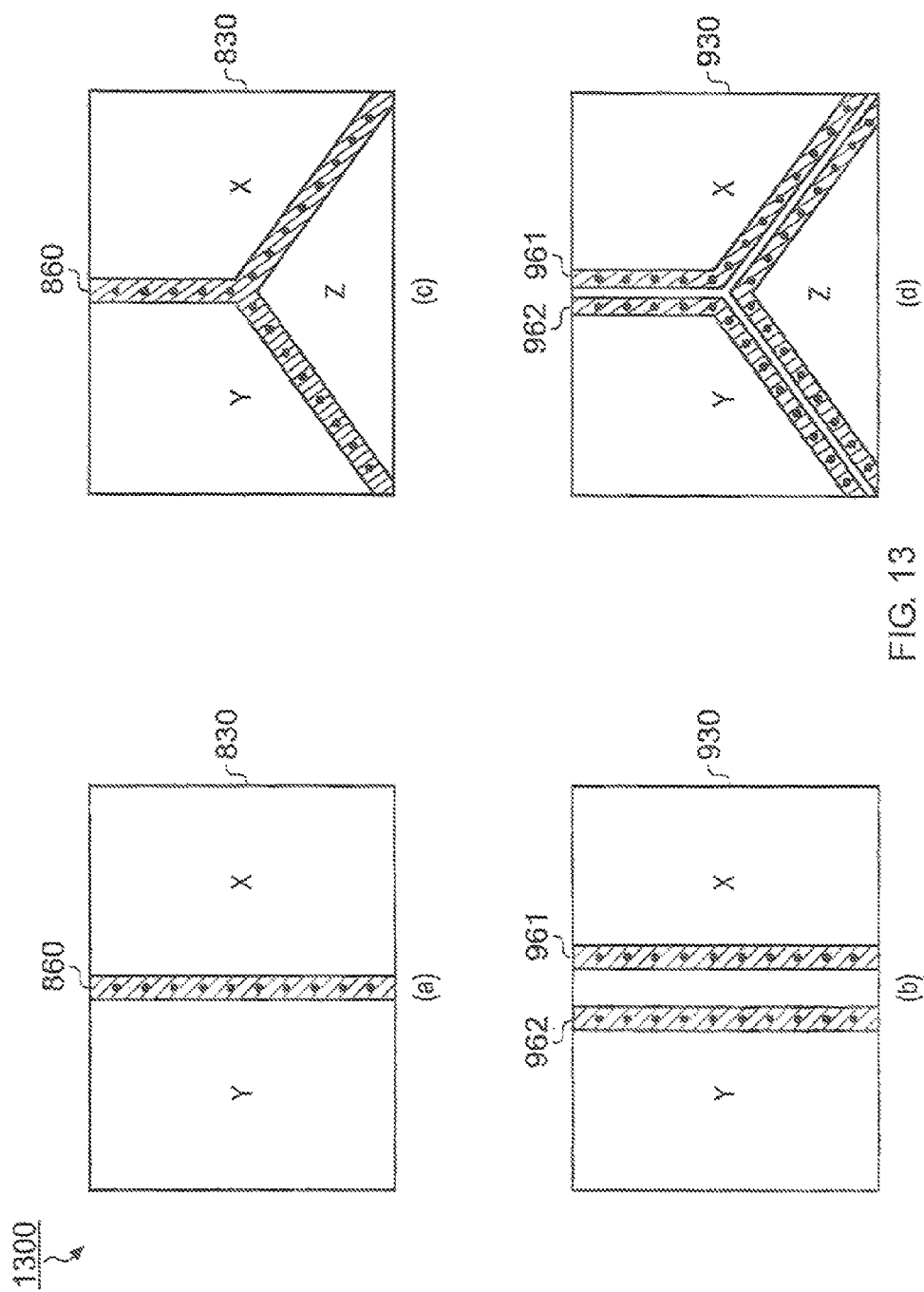
Figure 17:
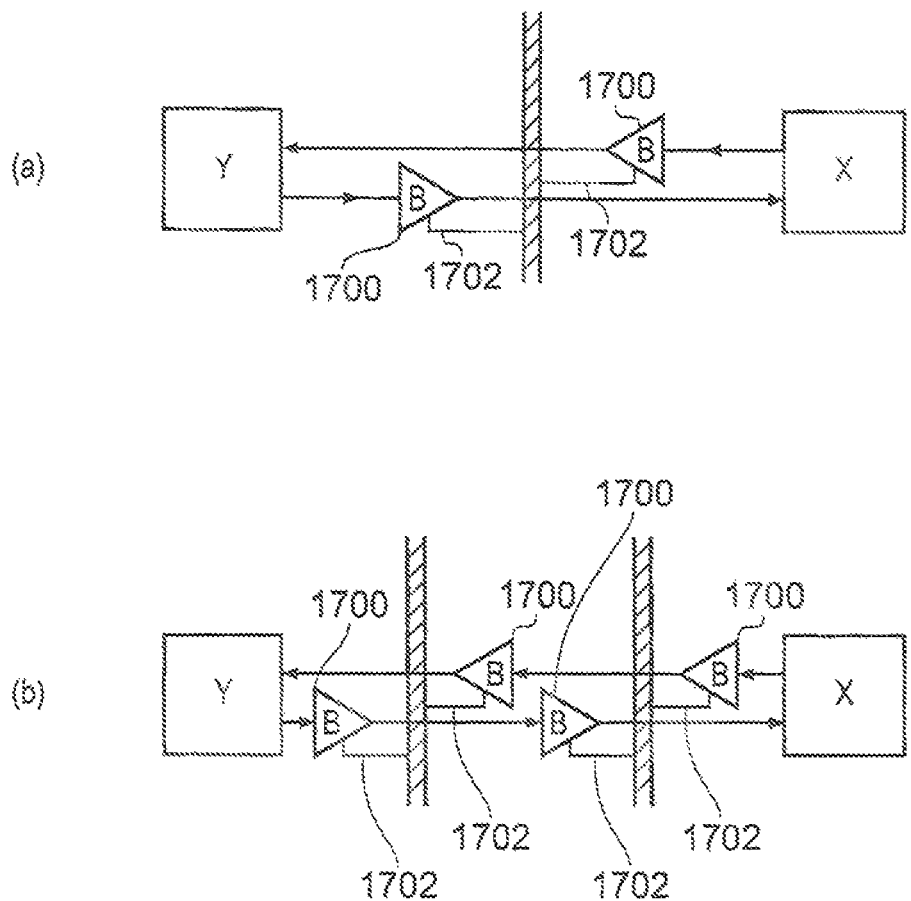
Figure 18:
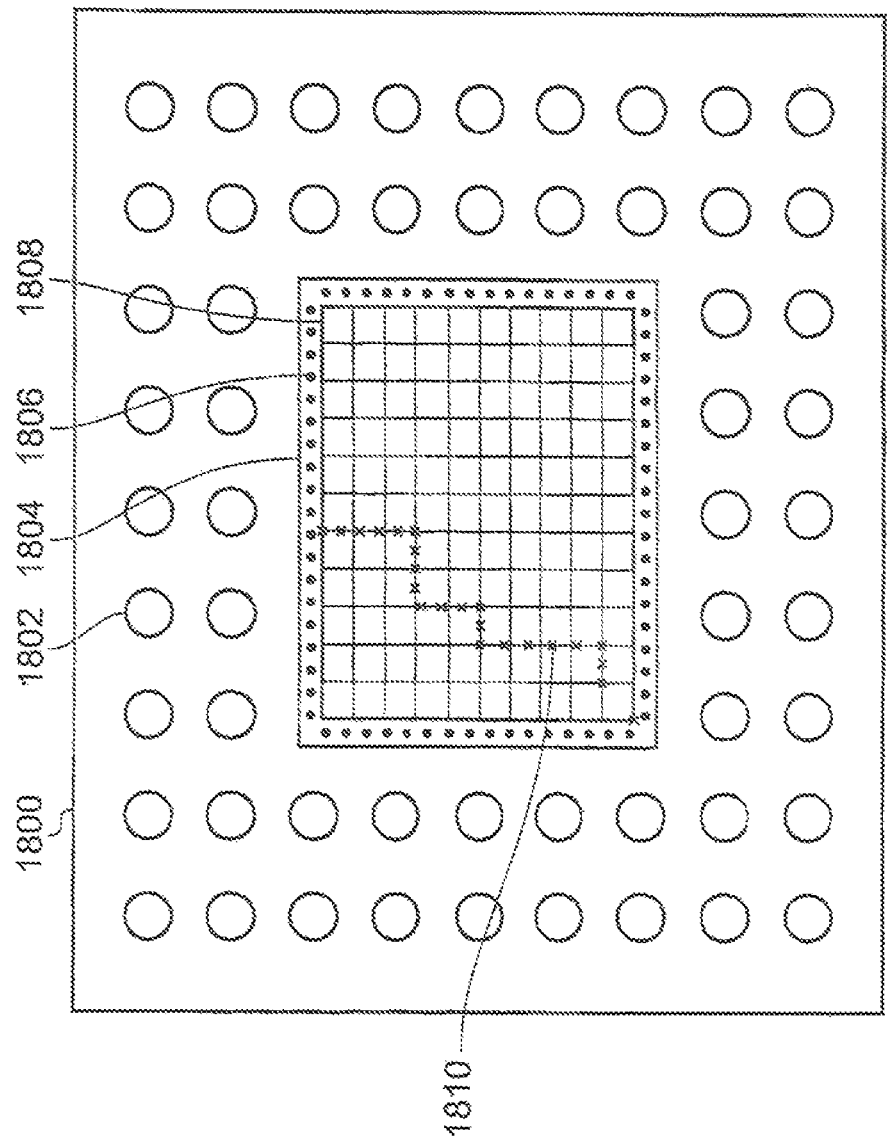

FIGS. 5A to 5D present schematic diagrams 500A to 500D which represent relevant parts of circuitry arrangement 400 for a comparison to be made with FIGS. 3A and 3B;

FIG. 6 is a schematic diagram of a circuitry arrangement 600;

FIG. 7 is a schematic diagram of a circuitry arrangement 700;

FIG. 8 is a schematic diagram of a circuitry arrangement 800;

FIG. 9 is a schematic diagram of a circuitry arrangement 900;

FIG. 10 is a schematic diagram of a circuit 1000;

FIG. 11 presents simulation results;

FIGS. 12A and 12B are schematic diagrams of flip chips 830 and 930;

FIG. 13 is a schematic diagram 1300 demonstrating elongate substrate contacts; and FIGS. 14(a) to 14(d) are schematic diagrams of flip chip layouts;

FIGS. 15(a) to 15(d) are schematic diagrams of different ground supply connections in flip-chip packages having one substrate contact;

FIGS. 16(a) to 16(h) are schematic diagrams of different ground supply connections in flip-chip packages having two substrate contacts;

FIGS. 17(a) and 17(b) are schematic diagrams showing use of buffer circuitry; and FIG. 18 is a schematic diagram of a possible flip-chip package contact layout.

In order to better understand embodiments of the present invention, a number of arrangements not directly embodying the present invention will be discussed by way of introduction to embodiments of the present invention.

FIG. 1 is a schematic diagram of a circuitry arrangement 1 representing the general area of electronic circuitry to which the present invention relates.

Circuitry arrangement 1 comprises a printed-circuit board (PCB) 10, a laminate substrate 20, and a flip chip 30. Laminate substrate 20 and flip chip 30 together form a flip-chip package 40. Flip chip 30 is connected in a face-down manner onto the upper face of the laminate substrate 20 via a ball grid array 42. Similarly, laminate substrate 20 is connected onto the upper face of the PCB 10 via a ball grid array 44.

Ball grid arrays 42 and 44 are used to form connections between the flip chip 30 and the laminate substrate 20, and between the laminate substrate 20 and the PCB 10, for the following reasons. Firstly, the balls of such ball grid arrays can be closely spaced together, which enables miniature packages with high pin-counts to be realised. Secondly, the balls of such ball grid arrays have a lower thermal resistance than traditional lead connections. This allows heat generated by integrated circuits inside such packages to flow more easily to the laminate substrate and to the PCB, preventing the flip chip from overheating. Thirdly, the balls of such ball grid arrays provide a shorter conductive path than traditional lead connections. Accordingly, the balls of such ball grid arrays provide lower inductance connections than traditional lead connections and therefore have far superior electrical performance. This has become increasingly important as the speed at which electronic circuits operate has increased.

It will be appreciated that many different types of flip-chip connection array may be employed in place of a ball grid array, for example arrays of posts, bumps or pillars. Further, such arrays may be filled (e.g. area bump) arrays or not-filled (e.g. peripheral bump) arrays, and may be regular or irregularpatterned arrays. Accordingly, references to ball grid arrays herein are considered to include reference to any flip-chip connection array technology.

FIG. 2 is a schematic diagram of a circuitry arrangement 100 not directly embodying the present invention.

Circuitry arrangement 100 comprises a PCB 110 and flip chips 150 and 160. Flip chip 150 contains noise-generating circuitry X and flip chip 160 contains noise-sensitive circuitry Y. Flip chips 150 and 160 are connected in a face-down manner onto the upper face of PCB 110 via ball grid arrays.

In accordance with normal PCB-design practice, PCB 110 has a laminate structure made up of multiple layers 111. Further, PCB 110 comprises one or more ground planes formed on one or more of the layers 111. In this case, PCB 110 has two such ground planes 112 and 114.

Also in accordance with normal PCB-design practice, PCB 110 comprises a grounded boundary 116. Grounded boundary 116 is made up of metal strips 117 on each layer 111 of the PCB 110 connected together by one or more vertical columns of vias 118. Each via is typically an individual drilled hole which is plated or filled with copper. Metal strips 117 are typically elongate, passing in and out of the page of FIG. 2 and connected together by a plurality of columns of vias 118 in a spaced-apart arrangement. Accordingly, such grounded boundaries 116 are often referred to as "picket fences".

As can be seen from FIG. 2, the grounded boundary 116 is positioned in the PCB 110 between the flip chips 150 and 160. Ground planes 112 and 114 extend across the width of the PCB 110 and are connected to the grounded boundary 116 on both sides thereof. The portion of the ground planes 112 and 114 on the right-hand side of the grounded boundary 116 and under the flip chip 150 provide a PCB ground supply for circuitry X, hereinafter PGX. Similarly, the portion of the ground planes 112 and 114 on the left-hand side of the grounded boundary 116 and under the flip chip 160 provide a PCB ground supply for circuitry Y, hereinafter PGY.

One of the balls 152 of the ball grid array for flip chip 150 serves as a chip ground terminal for circuitry X, hereinafter CGX. Chip ground terminal CGX is accordingly connected to PCB ground supply PGX as shown in FIG. 2, for example by a via in the upper layer 111 of PCB 110. Similarly, one of the balls 162 of the ball grid array for flip chip 160 serves a chip ground terminal for circuitry Y, hereinafter CGY. Chip ground terminal CGY is accordingly connected to PCB ground supply PGY as shown in FIG. 2, for example by a via in the upper layer 111 of PCB 110.

PCB 110 naturally has power supply planes and signal tracks, however for the purposes of the present explanation such planes and tracks are not shown. Balls of the ball grid array for flip chips 150 and 160 naturally serve as power supply and input/output (I/O) terminals, however for the purposes of the present explanation, connections from such balls are not shown. The number of balls in the ball grid arrays may, for example, run from tens to thousands (typically, hundreds).

As can be seen from FIG. 2, the grounded boundary 116 forms a common ground terminal, hereinafter CG, between the PCB ground supplies PGX and PGY such that those PCB ground supplies PGX and PGY are connected together.

The purpose of the grounded boundary 116, other than to form a common ground terminal CG, is to form a barrier for noise travelling through the layers 111 of the PCB 110 from one side to the other. The circuitry layout of circuitry arrangement 100 is however inherently advantageous in terms of noise transfer reduction between circuitry X and circuitry Y for other reasons, as will be explained with reference to FIGS. 3A and 3B.

FIG. 3A is a schematic diagram 200 of a circuit representation of the circuitry arrangement 100. Accordingly, PCB 110 and flip chips 150 and 160 are represented by corresponding dashed boxes in FIG. 3A.

Flip chip 150, containing circuitry X, has a chip ground terminal (CGX) 202, a chip power-supply terminal (CVX) 204, a chip I/O terminal (CIOX) 206, and driver circuitry 208 for driving terminal CIOX 206. Driver circuitry 208 is accordingly connected to terminals CGX 202 and CVX 204 to receiver power, and to terminal CIOX 206 to input and output signals.

PCB 110 has a PCB ground terminal (PGX) 210 as a ground supply for terminal CGX 202, a PCB power supply terminal (PVX) 212 as a power supply for terminal CVX 204, and a PCB I/O terminal (PIOX) 214 for inputting and outputting signals via terminal CIOX 206. PCB 110 further comprises a power supply 216 and a load 218. Power supply 216 is connected between terminals PGX 210 and PVX 212 to provide the power supply for circuitry X, and load 218 is connected between terminals PIOX 214 and PGX 210 and serves as a load for signals output from circuitry X.

Flip chip 160, containing circuitry Y, has a chip ground terminal (CGY) 222, a chip power-supply terminal (CVY) 224, a chip I/O terminal (CIOY) 226, and driver circuitry 228 for driving terminal CIOY 226. Driver circuitry 228 is accordingly connected to terminals CGY 222 and CVY 224 to receive power, and to terminal CIOY 226 to input and output signals.

PCB 110 has a PCB ground terminal (PGY) 230 as a ground supply for terminal CGY 222, a PCB power supply terminal (PVY) 232 as a power supply for terminal CVY 224, and a PCB I/O terminal (PIOY) 234 for inputting and outputting signals via terminal CIOY 226. PCB 110 further comprises a power supply 236 and a load 238. Power supply 236 is connected between terminals PGY 230 and PVY 232 to provide the power supply for circuitry Y, and load 238 is connected between terminals PIOY 234 and PGY 230 and serves as a load for signals output from circuitry Y.

As already explained, the relevant connections between PCB 100 and flip chips 150 and 160 are made via balls of the ball grid arrays. Accordingly, in this way, terminal CGX 202 is connected to terminal PGX 210, terminal CVX 204 is connected to terminal PVX 212, and terminal CIOX 206 is connected to terminal PIOX 214. Similarly, in this way, terminal CGY 222 is connected to terminal PGY 230, terminal CVY 224 is connected to terminal PVY 232, and terminal CIOY 226 is connected to terminal PIOY 234.

Although the balls of the ball grid arrays have relatively low inductance, an impedance still exists between the relevant terminals which is modelled for the present purposes as can be seen in FIG. 3A.

A ground impedance ($Z_{XG}$) 240 exists between terminals CGX 202 and PGX 210, a power supply impedance ($Z_{XVDD}$) 242 exists between terminals CVX 204 and PVX and an I/O impedance ($Z_{XIO}$) 244 exists between terminals CIOX 206 and PIOX 214.

Similarly, a ground impedance ($Z_{YG}$) 250 exists between terminals CGY 222 and PGY 230, a power supply impedance ($Z_{YVDD}$) 252 exists between terminals CVY 224 and PVY 232, and an I/O impedance ($Z_{YIO}$) 254 exists between terminals CIOY 226 and PIOY 234.

Accordingly, two circuit networks exist in the schematic diagram 200 as explained above, one for circuitry X and the other for circuitry Y. Currents therefore flow in loops around those networks, as follows.

When driver 208 of circuitry X sources current, a current may be considered to flow in a loop from driver 208 to terminal CIOX 206, across impedance $Z_{XIO}$ 244 to terminal PIOX 214, through load 218 to terminal PGX 210, through power supply 216 to terminal PVX 212, across impedance $Z_{XVDD}$ 242 to terminal CVX 204, and back to the driver 208.

When driver 208 of circuitry X sinks current, a current may be considered to flow in a loop from load 218 to terminal PIOX 214, across impedance $Z_{XIO}$ 244 to terminal CIOX 206, via driver 208 to terminal CGX 202, across impedance $Z_{XG}$ 240 to terminal PGX 210, and back to the load 218. When that current flows, it can therefore be appreciated that a voltage $V_X$ will be induced across impedance $Z_{XG}$ 240, which will fluctuate as the signal level changes and with other noise in the current.

When driver 228 of circuitry Y sources current, a current may be considered to flow in a loop from driver 228 to terminal CIOY 226, across impedance $Z_{YIO}$ 254 to terminal PIOY 234, through load 238 to terminal PGY 230, through power supply 236 to terminal PVY 232, across the impedance $Z_{YVDD}$ 252 to terminal CVY 224, and back to the driver 228.

When driver 228 of circuitry Y sinks current, a current may be considered to flow in a loop from load 238 to terminal PIOY 234, across impedance $Z_{YIO}$ 254 to terminal CIOY 226, via driver 228 to terminal CGY 222, across impedance $Z_{YG}$ 250 to terminal PGY 230, and back to the load 238. When that current flows it can therefore be appreciated that a voltage $V_Y$ will be induced across impedance $Z_{YG}$ 250, which will fluctuate as the signal level changes and with other noise in the current.

As will be appreciated from FIG. 3A, and by comparing it with FIG. 2, terminals PGX 210 and PGY 230 are connected together. For the benefit of further explanation, terminals PGX 210 and PGY 230 are assumed to be connected together via a common ground terminal (CG) 260, which may, for example, be considered to be the grounded boundary 116 of FIG. 2.

Because the ground terminals PGX 210 for circuitry X and PGY 230 for circuitry Y are connected together via common ground terminal CG 260, that common ground terminal CG 260 acts as a single reference point, or "star point", for voltages $V_Y$ and $V_X$.

FIG. 3B is a reduced schematic diagram 300 which represents relevant parts of FIG. 3A. As can be seen from FIG. 3B, impedance $Z_{XG}$ 240 is effectively connected between terminals CGX 202 and CG 260, and impedance $Z_{YG}$ 250 is effectively connected between terminals CGY 222 and CG 260. The voltages $V_X$ and $V_Y$ fluctuate over impedances $Z_{XG}$ 240 and $Z_{YG}$ 250, respectively, relative to terminal CG 260, and do not affect one another. Currents circulate around the networks for circuitry X and circuitry Y without affecting one another. Accordingly, circuitry arrangement 100, represented by schematic diagram 200, provides good noise insulation between circuitry X and circuitry Y. Noise on voltage $V_X$ does not affect voltage $V_Y$. As will be appreciated from later explanation, the reason for this good noise insulation is that there is substantially no common impedance between the circuitry network for circuitry X and the circuitry network for circuitry Y.

Figure 4:
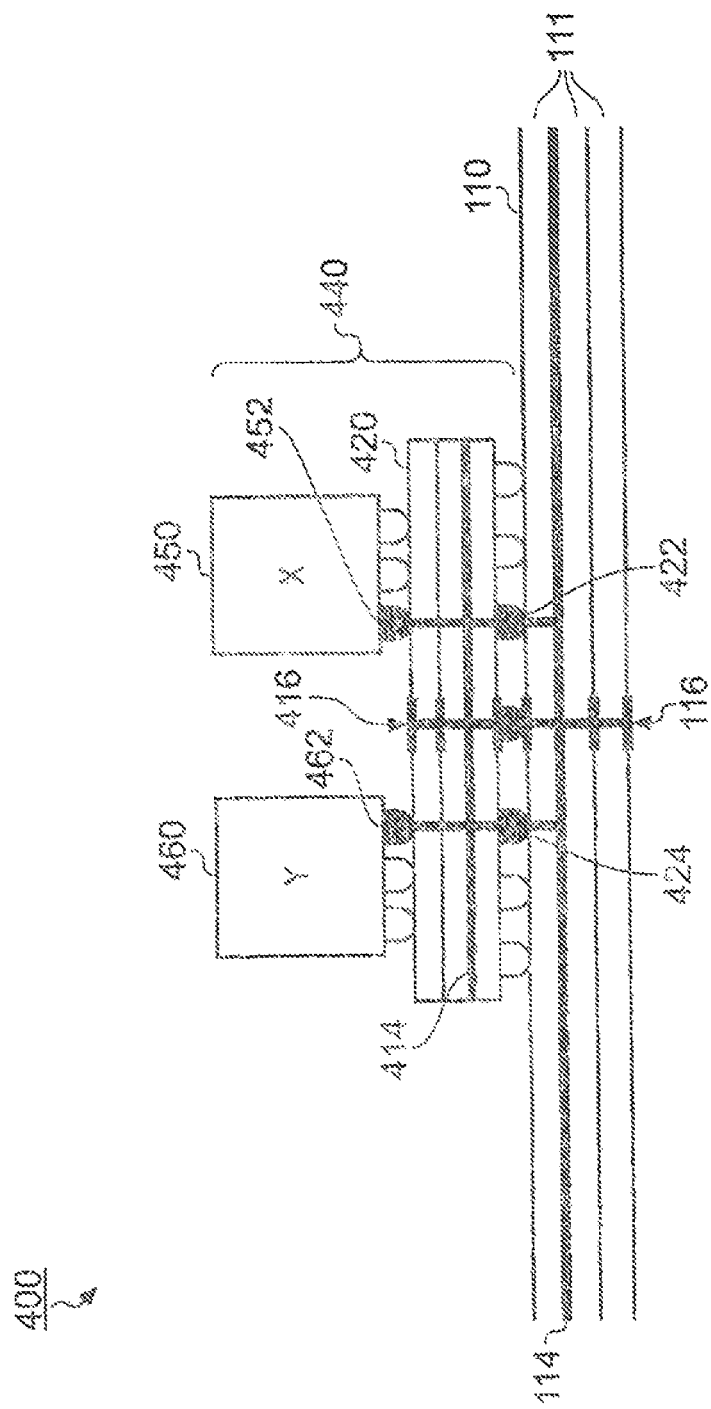
FIG. 4 is a schematic diagram of a circuitry arrangement 400.

FIG. 4 is a schematic diagram of a circuitry arrangement 400 not directly embodying the present invention. Similarly to circuitry arrangement 100, circuitry arrangement 400 comprises PCB 110 and flip chips 450 and 460, equivalent to flip chips 150 and 160.

PCB 110 has ground plane 114 and grounded boundary 116. For simplicity, PCB 110 is not shown having ground plane 112, however it will be appreciated that PCB 110 may have several ground planes.

Flip chips 450 and 460 are connected in a face-down manner onto the upper surface of a laminate substrate 420, equivalent to laminate substrate 20 of FIG. 1. Flip chips 450 and 460 and laminate substrate 420 therefore together form a flip-chip package 440, equivalent to flip-chip package 40 of FIG. 1.

Flip-chip package 440 is connected onto the upper surface of PCB 110 such that, similarly to circuitry arrangement 100, the grounded boundary 116 is located between flip chips 450 and 460.

With the advantages of circuitry arrangement 100 in mind, the laminate substrate 420 of the flip-chip package 440 has been structured similarly to the PCB 110. That is, laminate substrate 420 has a ground plane 414 extending across one (or more) of its layers, and a grounded boundary 416 (equivalent to grounded boundary 116) located in the laminate substrate 420 and between flip chips 450 and 460.

The grounded boundaries 416 and 116 are located such that grounded boundary 416 is above grounded boundary 116. Further, grounded boundary 416 is connected to grounded boundary 116 via the ball grid array of the laminate substrate 420 so as to form a combined grounded boundary.

The portion of the ground planes 114 and 414 on the right-hand side of the grounded boundaries 116 and 416 provide a combined PCB and package ground supply PGX for circuitry X, and the portion of the ground planes 114 and 414 on the left-hand side of the grounded boundaries 116 and 416 provide a combined PCB and package ground supply PGY for circuitry Y.

Accordingly, one of the balls 452 of the ball grid array of flip chip 450 serves as a chip ground terminal CGX for circuitry X, and is connected to the combined ground supply PGX. As shown in FIG. 4, the connection between the terminal CGX 452 and the combined ground supply PGX is made by vias connecting down from terminal CGX 452 to a corresponding ball 422 in the ball grid array of the laminate substrate 420 via the ground plane 414, and by a via connecting ball 422 down to ground plane 114.

Similarly, one of the balls 462 of the ball grid array of flip chip 460 serves as a chip ground terminal CGY for circuitry Y, and is connected to the combined ground supply PGY. As shown in FIG. 4, the connection between terminal CGY 462 and the combined ground supply PGY is made by vias connecting down from terminal CGY 462 to a corresponding ball 424 in the ball grid array of the laminate substrate 420 via the ground plane 414, and by a via connecting the ball 424 down to ground plane 114.

Again, PCB 110 and laminate substrate 420 naturally have power supply planes and signal tracks, however for the purposes of the present explanation such planes and tracks are not shown. Also, balls of the ball grid array for flip chips 450 and 460 naturally serve as power supply and I/O terminals, however for the purposes of the present explanation connections from such balls are not shown. The number of balls in the ball grid arrays may, for example, run from tens to thousands (typically, hundreds).

As can be seen from FIG. 4, the grounded boundaries 416 and 116 form a common ground terminal CG between combined ground supplies PGX and PGY such that those combined ground supplies PGX and PGY are connected together. However, the circuitry layout of circuitry arrangement 400 does not possess the same inherent advantages in terms of noise transfer reduction as previously explained in respect of circuitry arrangement 100, for the following reasons.

It will be appreciated that it is possible to represent the circuitry arrangement 400 in a similar way to that provided in FIG. 3A in respect of circuitry arrangement 100. However, it will be further appreciated through a comparison of FIG. 2 with FIG. 4, that the structure of the ground supplies in the laminate substrate 420 and the PCB 110 of circuitry arrangement 400 do not provide a "star point" common ground reference point as in FIG. 3B.

In FIG. 2, the ground impedances are located on either side of the grounded boundary 116, which acts as the common ground terminal, and may be referred to as the "star point" in that circuitry arrangement. In FIG. 4, however, there is some common impedance between the ground network for circuitry X and the ground network for circuitry Y, for example due to the ball grid array connection between the grounded boundary 416 and the grounded boundary 116. The ground supply network in FIG. 4 is "lattice-like", as opposed to "V-shaped" as in FIG. 3B. Therefore, the reduced schematic diagram for circuitry arrangement 400 is therefore not the same as in FIG. 3B, but is instead as in FIG. 5A, as discussed below.

Figure 5A:
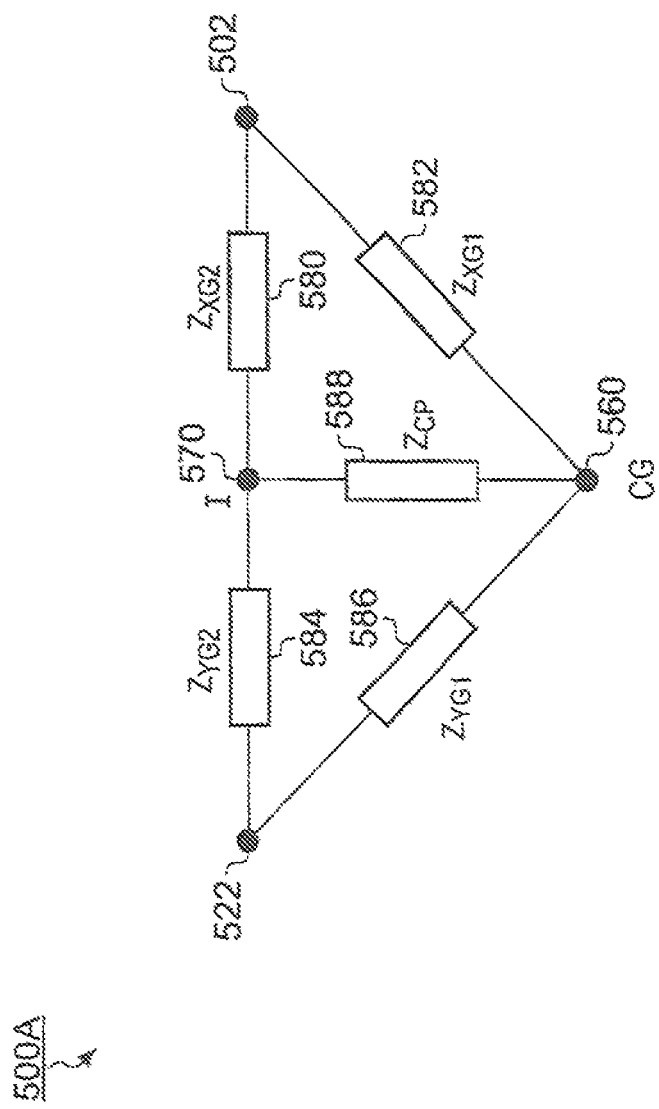

FIG. 5A is a schematic diagram 500A which represents the relevant parts of circuitry arrangement 400 for a comparison to be made with FIGS. 3A and 3B (which represent circuitry arrangement 100).

Schematic diagram 500A comprises terminals 502, 522, 560 and 570, and impedances 580, 582, 584, 586 and 588.

Terminal 502 represents a chip ground terminal CGX for flip chip 450, containing circuitry X, and terminal 522 represents a chip ground terminal CGY for flip chip 460, containing circuitry Y. Accordingly, terminals 502 and 522 are equivalent to terminals 202 and 222, respectively, as in FIG. 3B.

Terminal 560 represents a common ground terminal CG, which may, for example, be considered to be at the point where ground plane 114 meets grounded boundary 116. Accordingly, terminal 560 is equivalent to terminal 260 in FIG. 3B.

Because of the "lattice-like" arrangement in the circuitry arrangement 400, there is some "direct" impedance between terminal CGX 502 and terminal CG 560, represented by impedance $Z_{XG1}$ 582, and some direct impedance between terminal CGY 522 and terminal CG 560, represented by impedance $Z_{YG1}$ 586. However, in addition to this "direct" impedance there are impedance paths between terminals CGX 502 and CG 560, and between terminals CGY 522 and CG 560, which are at least partly common between the networks for circuitry X and circuitry Y.

This is represented in FIG. 5A by two paths, the first passing from terminal CGX 502 to terminal CG 560 via an intermediate terminal I 570, and the second passing from terminal CGY 522 to terminal CG 560 also via terminal I 570. These paths effectively form a "T-piece" in schematic diagram 500A. In these paths, there are therefore impedances attributed to the separate ground networks for circuitry X and circuitry Y where those paths are separate from one another (i.e. forming the cross-bar of the T-piece), and there is a common path impedance (common to both such ground networks) where those paths effectively coincide with one another (i.e. forming the vertical shaft of the T-piece).

In FIG. 5A, impedance $Z_{XG2}$ 580 is therefore connected between terminals CGX 502 and I 570 and is attributed to the path for ground network for circuitry X, and impedance $Z_{YG2}$ 584 is connected between terminals CGY 522 and I 570 and is attributed to the path for ground network for circuitry Y. The impedance $Z_{CP}$ 588, the common path impedance, is connected between terminals I 570 and CG 560 and is common to the paths of both ground networks.

As will be appreciated by comparison to FIG. 3B, currents flowing in the circuit network for circuitry X will induce a voltage over common path impedance $Z_{CP}$ 588. This will directly affect currents flowing in the circuit network for circuitry Y. Therefore, noise generated by circuitry X will impact on the operation of circuitry Y and accordingly the circuitry arrangement 400 is considered to be unsatisfactory from the point of view of noise performance. It will be understood that the previously-mentioned T-piece arrangement of impedances is the main cause of this problem. This can be better understood with reference to FIGS. 5B to 5D.

FIG. 5B is a schematic diagram 500B representing the "T-piece" arrangement of impedances of schematic diagram 500A. Accordingly, terminals 502, 522, 560 and 570, and impedances $Z_{XG2}$ 580, $Z_{YG2}$ 584 and $Z_{CP}$ 588 of FIG. 5A are shown in FIG. 5B connected together in the same way.

For convenience, the T-piece of FIG. 5A is shown in a star-shaped form. It will therefore be appreciated that the star of impedances in FIG. 5B may be subject to star-delta transformation to produce an equivalent network of impedances in a delta-shaped form.

FIG. 5C is a schematic diagram 500C representing a delta-shaped arrangement of impedances produced by subjecting the impedance network of schematic diagram 500B to star-delta transformation.

Schematic diagram 500C accordingly comprises impedance $Z_A$ 592 connected between terminals 522 and 560, impedance $Z_B$ 594 connected between terminals 560 and 502, and impedance $Z_C$ 596 connected between terminals 522 and 502. By such star-delta transformation, the values of $Z_A$, $Z_B$ and $Z_C$ may be calculated as follows:

$$Z_A = \frac{P}{Z_{XG2}}$$

$$Z_B = \frac{P}{Z_{YG2}}$$

$$Z_C = \frac{P}{Z_{CP}}$$

where $$P = Z_{XG2}Z_{YG2} + Z_{XG2}Z_{CP} + Z_{YG2}Z_{CP}$$

With the above star-delta transformation complete, it will be appreciated that the delta of impedances of FIG. 5C may be substituted for the T-piece (star) of impedances of FIG. 5A, those two sets of impedances being equivalent to one another.

FIG. 5D is a schematic diagram 500D representing a version of schematic diagram 500A in which the delta of impedances of FIG. 5C has been substituted for the T-piece of impedances. Accordingly, as can be seen from FIG. 5O, the impedance $Z_A$ 592 is connected between terminals 522 and 560 in parallel with impedance $Z_{YG1}$ 586, impedance $Z_B$ 594 is connected between terminals 502 and 560 in parallel with impedance $Z_{XG1}$ 582, and impedance $Z_C$ 596 is connected between terminals 522 and 502.

By comparison of FIG. 5D with FIG. 3B, it will be appreciated that voltages over parallel-connected impedances $Z_{XG1}$ 582 and $Z_B$ 594 can fluctuate relative to terminal 560 without affecting voltages over parallel-connected impedances $Z_{YG1}$ 586 and $Z_A$ 592. However, a voltage over impedance $Z_C$ (which may be considered to be a common impedance, being a transformed version of common path impedance $Z_{CP}$ 588) fluctuating due to currents in circuitry X will affect currents in circuitry Y. Therefore, as mentioned above, noise generated by circuitry X will impact upon the operation of circuitry Y such that circuitry arrangement 400 is considered unsatisfactory from the point of view of noise performance. It will therefore now be understood that the common impedance $Z_C$ (whose value is dependent on the T-piece of FIG. 5A) is the main cause of this problem.

FIG. 6 is a schematic diagram of a circuitry arrangement 600 not directly embodying the present invention. It will be appreciated that circuitry arrangement 600 is closely similar to circuitry arrangement 400. Accordingly, a detailed description of the elements of circuitry arrangement 600 common to circuitry arrangement 400 is omitted.

Circuitry arrangement 600 differs from circuitry arrangement 400 in that laminate substrate 620 has been substituted for laminate substrate 420. Laminate substrate 620 is the same as laminate substrate 420 except that the single ground plane 414 extending across the laminate substrate 420 has been replaced with two separate ground planes 602 and 604. Ground planes 602 and 604 may be considered to have been formed by effectively disconnecting ground plane 414 from the grounded barrier 416 on either side thereof. Laminate substrate 620 and flip chips 450 and 460 together form flip-chip package 640.

Circuitry arrangement 600 accordingly has two separate ground planes in the laminate substrate 620, namely ground plane 602 on the right-hand side of grounded boundary 416 for circuitry X, and ground plane 604 on the left-hand side of grounded boundary 416 for circuitry Y. Grounded boundary 416 is therefore disposed between the circuit network for circuitry X and the circuit network for circuitry Y and provides some noise isolation between the networks in the laminate substrate due to its "picket fence" structure.

By comparing circuitry arrangement 600 with circuitry arrangements 400 and 100, it will be appreciated that the ground supply network of circuitry arrangement 600 is of a "V-shaped" form similar to circuitry arrangement 100, rather than of a "lattice-like" form as in circuitry arrangement 400. Accordingly, circuitry arrangement 600 may be considered to have a reduced schematic diagram equivalent to the schematic diagram 300 of FIG. 3B, rather than a reduced schematic diagram equivalent to schematic diagram 500D of FIG. 5D.

That is, substantially no common impedance exists in circuitry arrangement 600 and accordingly it provides good noise isolation between circuitry X and circuitry Y in the same way as explained above in respect of circuitry arrangement 100.

FIG. 7 is a schematic diagram of a circuitry arrangement 700 not directly embodying the present invention. It will be appreciated that circuitry arrangement 700 is closely similar to circuitry arrangement 600. Accordingly, a detailed description of the elements of circuitry arrangement 700 common to the circuitry arrangement 600 is omitted.

Circuitry arrangement 700 differs from circuitry arrangement 600 in that flip chips 450 and 460 have been together replaced with flip chip 730. Rip chip 730 and laminate substrate 620 together form flip-chip package 740.

As previously mentioned, the present invention considers flip chips containing two or more circuitry portions, including a noise-generating circuitry portion and a noise-sensitive circuitry portion. Flip chip 730 comprises a noise-generating circuitry portion 732 and a noise-sensitive circuitry portion 734. For consistency with the previously-described arrangements, circuitry portion 732 therefore comprises circuitry X and circuitry portion 734 comprises circuitry Y. Also for consistency with previously-described arrangements, balls 452 and 462 may be considered to be chip ground terminals CGX and CGY, respectively.

By comparison with circuitry arrangement 600, it might be considered that circuitry arrangement 700 provides good noise insulation or isolation between circuitry X and circuitry Y, because it comprises the same laminate substrate 620 and PCB 110. However, this is not the case, as follows.

Unfortunately, noise generated by circuitry X couples to the circuitry Y via the substrate of flip chip 730, as indicated by arrow 750. The substrate of flip chip 730 acts as a common impedance between the two circuitry portions 732 and 734. This common impedance can be visualised as being equivalent to common impedance $Z_C$ 596 in FIG. 5D.

Accordingly, the presence of the substrate of flip chip 730 between the circuitry portions 732 and 734 tends to bring the performance of circuitry arrangement 700 closer to that of circuitry arrangement 400 than to that of circuitry arrangement 600. That is, the reduced schematic diagram for circuitry arrangement 700 tends to be closer to that of FIG. 5D (in which substantial common impedance is present) than to that of FIG. 3A (in which no common impedance is present).

FIG. 8 is a schematic diagram of a circuitry arrangement 800 comprising embodiments of the present invention. It will be appreciated that the circuitry arrangement 800 is similar to the circuitry arrangement 700. Accordingly, a detailed description of the elements of circuitry arrangement 800 common to the circuitry arrangement 700 is omitted.

Circuitry arrangement 800 differs from circuitry arrangement 700 in that flip chip 730 has been replaced with flip chip 830. Flip chip 830 and laminate substrate 620 together form flip-chip package 840.

Flip chip 830 comprises circuitry portions 732 and 734 as in flip chip 730. However, flip chip 830 further comprises a substrate contact 860.

Substrate contact 860 is located in the lower face of the substrate of flip chip 830 and between circuitry portions X 732 and Y 734. The part of flip chip 830 between circuitry portions X 732 and Y 734 (in which substrate contact 860 is located) may be referred to as an isolation zone. Preferably, substantially no noise-generating circuitry is formed in the isolation zone. Further, preferably no circuitry (other than the grounded boundary) is connected to the substrate contact. Embodiments of the present invention may however have circuitry connected to such substrate contacts and formed in the isolation zone as will be explained later.

Substrate contact 860 provides a conductive contact to the substrate of flip chip 830. For example, if the substrate of flip chip 830 is a lightly-doped p-type substrate, then substrate contact 860 may be a heavily-doped p-type diffusion in the p-type substrate surface.

As can be seen from FIG. 8, substrate contact 860 is connected to the grounded boundary 416 via ball 862 of the ball grid array between flip chip 830 and laminate substrate 620. Accordingly, a low impedance path is provided between substrate contact 860 and grounded boundary 116 and common ground plane 114 via grounded boundary 416.

The effect of substrate contact 860 and the conductive path via grounded boundaries 416 and 116 is that noise energy generated via circuitry X, which would otherwise be radiated via the substrate of flip chip 830 to circuitry Y (as indicated by arrow 750 in FIG. 7) is collected by the substrate contact 860 as indicated by arrow 850, before it is picked up by circuitry Y.

Accordingly, the presence of the substrate contact 860 and the conductive path via grounded boundaries 416 and 116 tends to bring the performance of circuitry arrangement 800 closer to that of circuitry arrangement 600 than to that of circuitry arrangement 700. That is, the reduced schematic diagram from circuitry arrangement 800 tends to be closer to that of FIG. 3A (in which no common impedance is present) than to that of FIG. 5D (in which substantial common impedance is present). It can therefore be seen that flip chip 830 of flip-chip package 840 enables a low noise package to be realised.

FIG. 9 is a schematic diagram of a circuitry arrangement 900 comprising embodiments of the present invention. It will be appreciated that the circuitry arrangement 900 is closely similar to circuitry arrangement 800. Accordingly, a detailed description of the elements of circuitry arrangement 900 common to the circuitry arrangement 800 is omitted.

Circuitry arrangement 900 differs from circuitry arrangement 800 in that flip-chip package 840 has been replaced with flip-chip package 940. Flip-chip package 940 comprises laminate substrate 920 and flip chip 930. Circuitry arrangement 900 further differs from circuitry arrangement 800 in that PCB 110 has been replaced with PCB 910.

PCB 910 differs from PCB 110 in that two spaced-apart grounded boundaries 116A and 116B are provided instead of a grounded boundary 116. Laminate substrate 920 differs from laminate substrate 620 in that two spaced-apart grounded boundaries 416A and 416B are provided instead of grounded boundary 416. Finally, flip chip 930 differs from flip chip 830 in that two spaced-apart substrate contacts 961 and 962 are provided in the isolation zone between circuitry portions 732 and 734, instead of substrate contact 860.

Substrate contact 961 and grounded boundaries 416A and 116A are connected together to form a first conductive path from substrate contact 961 to ground plane 114 in PCB 910. Similarly, substrate contact 962 and grounded boundaries 416B and 116B are connected together to form a second conductive path from substrate contact 962 to ground plane 114 in PCB 910.

Accordingly, the main difference between circuitry arrangement 900 and circuitry arrangement 800 is that two low impedance paths are formed between the substrate contacts 961 and 962 and ground plane 114. The substrate contact 961 is located between substrate contact 962 and circuitry portion 732, and substrate contact 962 is located between substrate contact 961 and circuitry portion 734. Accordingly, of the two low impedance paths, the one comprising substrate contact 961 is closer to circuitry X, and the one comprising substrate contact 962 is closer to circuitry Y.

Substrate contacts 961 and 962 have a similar effect to substrate contact 860 of circuitry arrangement 800. Noise energy generated by circuitry X, which would otherwise be radiated via the substrate of flip chip 930 to circuitry Y (as indicated by arrow 750 in FIG. 7), is collected by the substrate contacts 961 and 962 as indicated by arrows 950 and 951, respectively, before it is radiated to circuitry Y.

It has been found that, in practice, of the amount of noise energy collected by substrate contacts 961 and 962 in the form of noise currents, the majority of it is collected by substrate contact 961 (i.e. the closer of the contacts to circuitry X).

Similarly to circuitry arrangement 800, the presence of the substrate contacts 961 and 962 and the conductive paths via grounded boundaries 416A and 116A, and 416B and 116B, tends to bring the performance of circuitry arrangement 900 closer to that of circuitry arrangement 600 than to that of circuitry arrangement 700. That is, the reduced schematic diagram for circuitry arrangement 900 tends to be closer to that of FIG. 3A (in which no common impedance is present) than to that of FIG. 5D (in which substantial common impedance is present).

It can therefore be seen that flip chip 930 of flip-chip package 940 enables a low noise package to be realised. In practice, it has been found that circuitry arrangement 900 has better noise performance than circuitry arrangement 800, however circuitry arrangement 800 is preferable to circuitry arrangement 900 from the point of view of providing a generic flip-chip layout which can accommodate different circuits in place of circuitry X and circuitry Y from one flip chip to the next without requiring substantial layout re-design.

It will of course be appreciated that circuitry arrangements 800 and 900 (and other arrangements comprising embodiments of the present invention) could, for example, be implemented such that flip chip packages 840 and 940 are flip-chip plastic ball grid array (FC-PBGA) packages. Equally, however, circuitry arrangements 800 and 900 (and other arrangements comprising embodiments of the present invention) could be implemented using other flip-chip-package technologies. For example, circuitry arrangements 800 and 900 could be implemented as ceramic flip-chip packages. Optionally, circuitry arrangements 800 and 900 could be implemented with laminate substrate 620 being a single-layer substrate rather than a laminate substrate, for example being a single-layer film substrate. Optionally, circuitry arrangements 800 and 900 could be implemented without including laminate substrate 620 at all, for example by connecting the flip chip concerned directly to the PCB itself in a direct-chip-on-board arrangement.

It will of course be appreciated that the conductive paths between the substrate contacts and the ground plane in the PCB need not be formed of grounded boundaries, as in arrangements 800 and 900. For example, such paths may be formed of a column or set of columns of vias. However, grounded boundaries of the "picket-fence" type are advantageous as they act as barriers to lateral noise transmission.

It will also be appreciated that although circuitry arrangements 800 and 900 present embodiments of the present invention in which one and two substrate contacts, respectively, are employed in the isolation zone (so as to create one and two low impedance paths, respectively, to the ground plane in the PCB), the invention extends to more than two such paths and substrate contacts, for example, three or more.

It will also be appreciated that although circuitry arrangements 800 and 900 are shown in cross-section in FIGS. 8 and 9, circuitry portions 732 and 734 occupy an area of the flip chip concerned when viewed from above. Accordingly, it will be appreciated that the isolation zone between those circuitry portions may be generally elongate (or of any other shape) when viewed from above, forming a channel between the two circuitry portions. It will therefore further be appreciated that substrate contacts 860, 961 and 962 may be similarly elongate, running along the isolation zone channel between the two circuitry portions. Those substrate contacts may therefore take the general form of a wall or ridge. The same may therefore be true of the grounded boundaries located below the substrate walls, for example forming walls of a "picket fence" structure. The "walls" of substrate contacts may therefore be connected to their grounded boundaries via a set of ball-grid-array balls located beneath and along those walls. The substrate-contact "walls" need not be continuous, and may therefore take a "broken" or dashed-line form. However, it will be appreciated that any gaps along the wall should not be so large as to allow significant noise to conduct therethrough.

It will of course be appreciated that the grounded boundaries of circuitry arrangements 800 and 900 need not be located directly beneath their corresponding substrate contacts, as long as the relevant conductive paths are formed. For example, the conductive paths may pass laterally along a layer of the laminate substrate (or, PCB) at some point therealong. Preferably, however, the grounded boundaries themselves are generally vertical as shown in FIGS. 8 and 9 (i.e. perpendicular to the main plane of the laminate substrate concerned) so as to minimize path length and therefore inductance.

It is emphasised that FIGS. 8 and 9 are schematic, and that the variety of sizes of the various elements thereof do not reflect actual relative sizes in an implemented embodiment.

FIG. 10 is a schematic diagram of a circuit 1000, which may be used to represent flip chips 830 and 930 embodying the present invention. Circuit 1000 accordingly comprises circuitry portions 732 and 734 containing circuitry X and Y, respectively. In order to represent both flip chip 830 and flip chip 930, substrate contacts 961 and 962 are shown joined together by a dashed line, such that the combination of them schematically represents substrate contact 860.

Circuitry 1000 demonstrates that the substrate of flip chips 830 and 930 effectively forms a multi-stage resistive attenuator between the circuitry portions 732 and 734 and the substrate contact 860 or contacts 961 and 962, comprising lateral resistances $R_L$ extending in series between the circuitry portions, and vertical resistances $R_V$ each extending from between a pair of the lateral resistances $R_L$ to the substrate contact or contacts.

The dimension T in FIG. 10 represents the thickness of the substrate of the flip chips 830 and 930. The dimension W in FIG. 10 represents the width of substrate contact 860, or, in the case of flip chip 930, the width between the edge of substrate contact 961 closest to circuitry X to the edge of substrate contact 962 closest to circuitry Y.

As the ratio W/T increases, for example by thinning the substrate (reducing T) and/or by increasing the substrate width W, the lateral resistance $R_L$ increases and the vertical resistance $R_V$ decreases. That is, as the ratio W/T increases, the attenuation between circuitry portions 732 and 734 increases and a greater proportion of noise generated by circuitry X is collected by the substrate contact 860, or contacts 961 and 962, before it reaches circuitry Y.

It will of course be appreciated that the width W may vary along the substrate contact or set of contacts. That is, the width W may be varied along a substrate contact to take account of different circuitry portions on either side of it. This will lead to a larger width W for greater noise isolation between circuitry portions that require such noise isolation, and a smaller width W for less noise isolation between circuitry portions that do not need as much noise isolation.

Simulations have been carried out to examine the effect of varying ratio W/T on noise performance. The results of those simulations are shown in FIG. 11.

FIG. 11 presents results of simulations conducted to examine the effect of ratio W/T on noise performance. For those simulations, a circuitry arrangement of the form of circuitry arrangement 900 (i.e. having two substrate contacts) has been employed. In each simulation, circuitry X is high-speed digital circuitry and circuitry Y is analogue circuitry.

The flip chip in each simulation is assumed to have a 4 mm×4 mm chip core size, twin-well digital circuitry with 10 nF damped on-chip digital decoupling, and two in-package ultra-low-inductance (50 pH) IDC capacitors (DVDD-DVSS).

In each simulation, dimension W is 350 μm with each substrate contact having a width of 150 μm. From one simulation to the next, the substrate thickness T of the flip chip is varied. Consequently, in the results of FIG. 11, line L1 is for T=320 μm, line L2 is for T=150 μm, line L3 is for T=100 μm, line L4 is for T=75 μm, and line L5 is for T=50 μm.

In FIG. 11, the top graph shows the digital supply noise in the digital circuitry (circuitry X). This is the same for each simulation and thus lines L1 to L5 appear as a single line. The upper-middle graph shows the noise current collected by the first substrate contact (substrate contact 961 in FIG. 9), the lower-middle graph shows the noise current collected by the second substrate contact (substrate contact 962 in FIG. 9), and the bottom graph shows the noise current collected by the analogue circuitry (circuitry Y).

As can be seen from the graph peaks in FIG. 11, when T=320 μm (i.e. when W/T is approximately 1), the noise current collected by the first substrate contact is around 4 mA, the noise current collected the second substrate contact is around 1 mA, and the noise current picked up by the analogue circuitry is around 600 μA. That is, when W/T is approximately 1, of the total noise current, around 71% is collected by the first substrate contact, around 18% is collected by the second substrate contact, and around 11% is picked up by the analogue circuitry.

When T=50 μm (i.e. when W/T=7), the noise current collected by the first substrate contact is around 3 mA, the noise current collected by the second substrate contact is around 20 μA, and the noise current picked up by the analogue circuitry is around 2 μA. Therefore, when W/T is approximately 7, of the total noise current, around 99% is collected by the first substrate contact, almost 1% is collected by the second substrate contact, and virtually none (0.01%) is picked up by the analogue circuitry.

This is a remarkable improvement in noise performance given that by making the substrate approximately six times as thin (increasing W/T from approximately 1 to 7), the percentage noise current picked up by the analogue circuitry has reduced by over 100 times. In real terms, the current picked up by the analogue circuitry has reduced from 600 μA to 2 μA, i.e. by 300 times.

In practice, it has been found that by increasing W/T to 4, the attenuation effect has become significantly large, so that W/T≥4 may be considered a satisfactory design condition. Examining FIG. 11, when T=75 μm (i.e. when W/T is just over 4) the noise current picked up by the analogue circuitry has reduced from 600 μA (when W/T is approximately 1) to around 3 μA, i.e. by 200 times.

If, for example, flip chips embodying the present invention are made from substrates having a thickness of 100 μm, then for W/T=4 a substrate contact width W of 400 μm would be required. This is an acceptable value for W, however it is desirable to reduce this width. It is envisaged that by employing wafer thinning techniques, a thickness T=25 μm could be achieved, enabling W=100 μm to be employed.

Of course, W/T is <4 would provide satisfactory noise isolation for many applications, depending on the amounts of noise generated by circuitry X and the sensitivity of circuitry Y to such noise. For example, W/T=3, or W/T=2, may be acceptable.

FIGS. 12A and 12B are schematic diagrams of flip chips 830 and 930, respectively, for the purpose of appreciating possible dimensions of elements within those chips.

Dimension W1, the width of substrate contact 860, may be around 350 μm. Dimension W2, the width of the isolation zone between circuitry portions 732 and 734, may be around 400 μm. Dimension W3, the diameter of a bail of the ball grid array of the flip chip, may be around 50 μm. Dimension W4, the width of a metal strip of the grounded boundary 416, may be around 200 to 330 μm. Dimension W5, the width of a via in the laminate substrate, may be around 100 to 150 μm. Dimension W6, the width of the substrate contacts 961 and 962, may be around 150 μm. Dimension W7, the distance between substrate contacts 961 and 962, may be around 50 μm. Dimension W8, the distance between substrate contact 961 and circuitry portion 732, and the distance between substrate contact 962 and circuitry portion 734, may be around 25 µm. Finally, dimension T, the thickness of the substrates of flip chips 830 and 930, may be around 75 to 100 µm. The dimension T may of course be smaller if a larger ratio W/T is desired.

FIG. 13 is a schematic diagram 1300 for the purpose of demonstrating that substrate contacts 860, 961 and 962 may be elongate when viewed from above, and to demonstrate that more than two circuitry portions may be provided on a flip chip.

Diagrams (a) and (b) show flip chips 830 and 930, respectively, when viewed from above, in the case that only circuitry X and circuitry Y are present. Diagrams (c) and (d) show flip chips 830 and 930, respectively, in the case that three circuitry portions are present; circuitry X, circuitry Y and circuitry Z.

The substrate contacts are shown cross-hatched in FIG. 13, and the dots therealong show that they may be connected to the laminate substrate below (not shown) via multiple balls of a ball grid array. As can be appreciated from FIG. 13, the substrate contacts appear as substrate walls or ridges separating the circuitry portions apart from one another.

The following schematic diagrams representing various features of the present invention will be considered in order to better understand the present invention.

Figure 14:
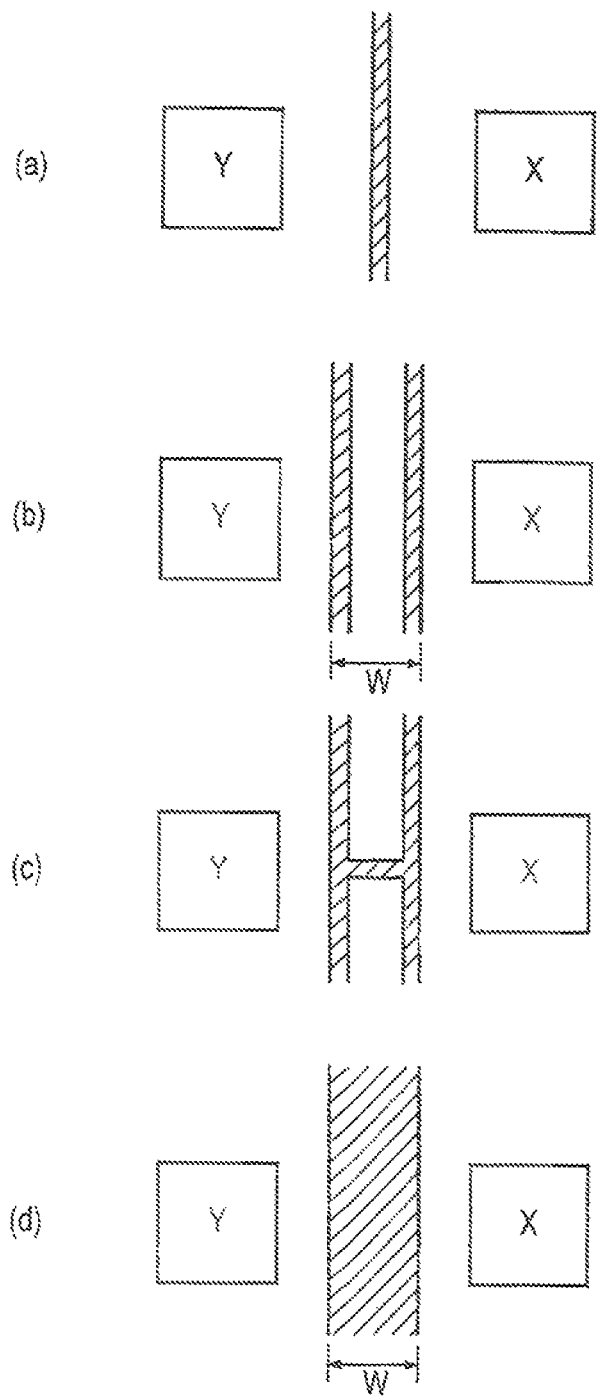

FIGS. 14(a) to 14(d) are schematic diagrams each representing a plan view of a flip chip. In FIG. 14(a), circuitry X and circuitry Y are spaced apart by a single substrate contact (shown as an elongate contact as in FIG. 13). In FIG. 14(b), circuitry X and circuitry Y are spaced apart by two such substrate contacts. FIG. 14(c) is the same as FIG. 14(b) except that the two substrate contacts are connected together. In FIG. 14(d), circuitry X and circuitry Y are spaced apart by a single substrate contact whose width W is the same as the width W measured between the outer edges of the two substrate contacts of FIG. 14(b).

Generally, the arrangement of FIG. 14(b) is considered to be preferable to the arrangement of FIG. 14(a), as previously considered with respect to circuitry arrangements 800 and 900. Considering the arrangement of FIG. 14(c), if the join between the two substrate contacts has a high resistance, then the two substrate contacts are substantially isolated from one another and the arrangement therefore approximates the arrangement of FIG. 14(b). If, however, the join has a low resistance, then this arrangement is considered less preferable because the join acts to conduct noise from one of the substrate contacts to the other. The arrangement of FIG. 14(d) may be considered as follows. The single substrate contact of FIG. 14(d) may be considered to be effectively connected to ground via an impedance Z. Similarly, each of the substrate contacts of FIG. 14(a) may be considered to be effectively connected to ground via an impedance Z. In this case, if Z is very small (i.e. effectively zero), then the arrangement of FIG. 14(d) is preferable to the arrangement of FIG. 14(b). If, however, Z is significant, then the arrangement of FIG. 14(b) is preferable to that of FIG. 14(d).

FIGS. 15(a) to 15(d) are schematic diagrams each representing a cross-sectional view through a flip chip mounted on a laminate substrate, each flip chip having (as in FIG. 8) circuitry X and circuitry Y spaced apart by a single substrate contact. The general representation of the flip chip, the laminate substrate and the ground supply connections are closely similar to that in FIG. 8 for ease of comparison therewith.

Figure 15:
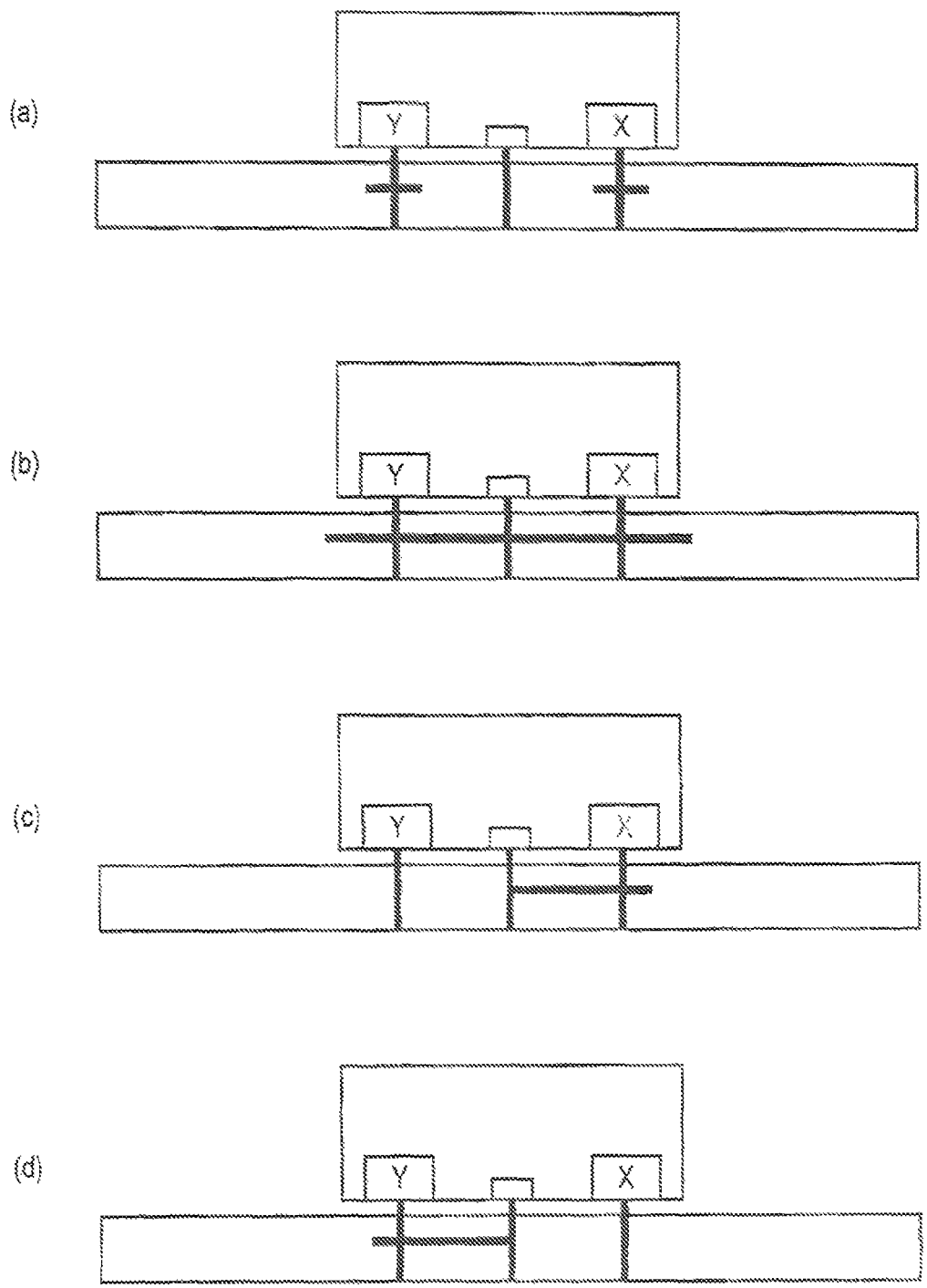

The difference between FIGS. 15(a) to 15(d) are in the connections between the ground supply connections for circuitry X, circuitry Y and the substrate contacts. In FIG. 15(a), the ground supply connections for circuitry X, circuitry Y and the substrate contact are separate from one another. Accordingly, the arrangement of FIG. 15(a) is equivalent to that in FIG. 8. In FIG. 15(b), the ground supply connections for circuitry X, circuitry Y and the substrate contact are connected to one another via a common ground plane in the laminate substrate. In FIG. 15(c), the ground supply connections for circuitry X and the substrate contact are connected together by a shared ground plane in the laminate substrate, and the ground supply connection for circuitry Y is separate therefrom. In FIG. 15(d), the ground supply connections for circuitry Y and the substrate contact are connected together via a shared ground plane in the laminate substrate, and the ground supply connection for circuitry X is separate therefrom.

By analogy with FIGS. 4 and 8, the arrangement of FIG. 15(a) is preferable to the arrangement of FIG. 15(b), because the arrangement in FIG. 15(b) has significant common impedance between circuitry X, circuitry Y and the substrate contact. If circuitry X is (as before) considered to be noise-generating circuitry, and circuitry Y considered to be noise-sensitive circuitry, the arrangement of FIG. 15(c) may serve to "broadcast" or "dump" noise into the substrate of the flip chip via the substrate contact because the ground supplies for the substrate contact and circuitry X are connected together. Similarly, the arrangement of FIG. 15(d) may serve to "pick up" noise from the substrate of the flip chip via the substrate contact and "dump" that noise into the ground supply for circuitry Y, because the ground supply connections for circuitry Y and the substrate contact are connected to one another. Accordingly, the arrangements of FIGS. 15(c) and 15(d) may be considered to have poor noise performance and are therefore considered to be undesirable compared to the arrangements of FIG. 15(a).

FIGS. 16(a) to 16(h) are schematic diagrams each representing a cross-sectional view through a flip chip mounted on a laminate substrate, each flip chip having (as in FIG. 9) circuitry X and circuitry Y spaced apart by two substrate contacts. The general representation of the flip chip, laminate substrate and ground supply connections are closely similar to that in FIG. 9 for ease of comparison therewith.

Figure 16:
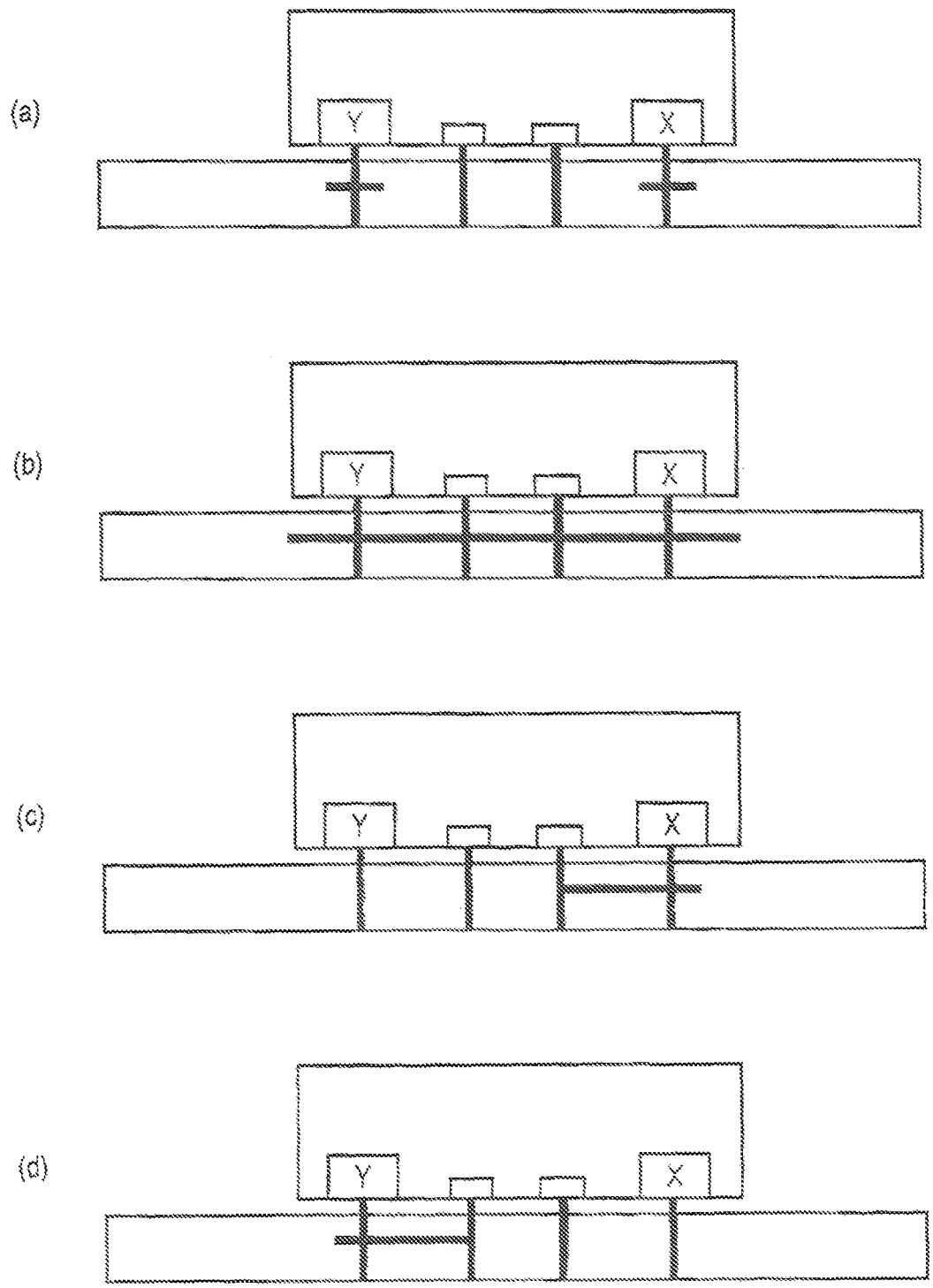
Figure 16:
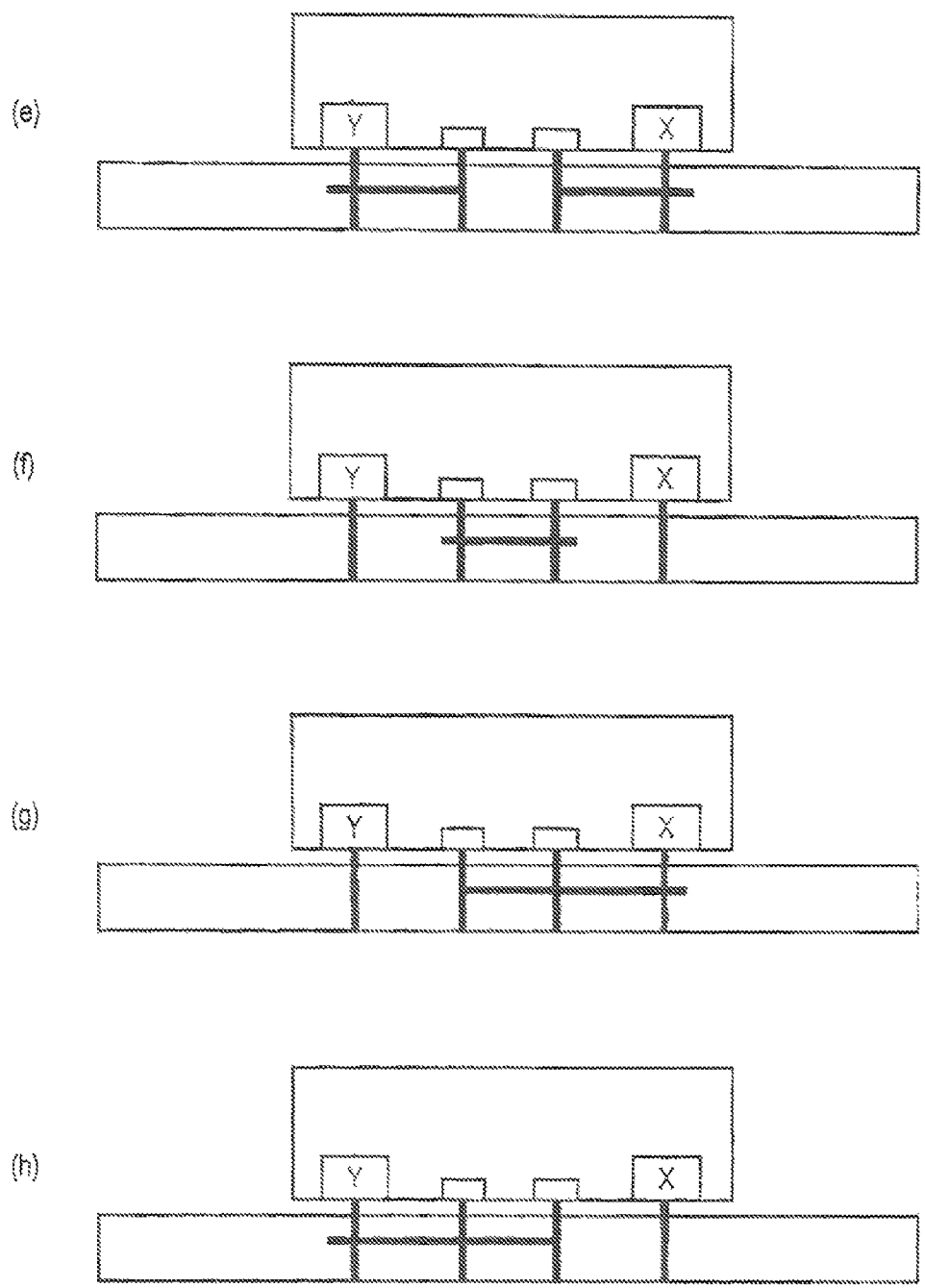

The differences between FIGS. 16(a) to 16(h) are in the connections between the ground supply connections for circuitry X, circuitry Y and the two substrate contacts. In FIG. 16(a) the ground supply connections for circuitry X, circuitry Y and the two substrate contacts are separate from one another. Accordingly, the arrangement of FIG. 16(a) is equivalent to that of FIG. 9. In FIG. 16(b), the ground supply connections for circuitry X, circuitry Y and the two substrate contacts are connected together by a common ground plane in the laminate substrate. In FIG. 16(c), the ground supply connections for circuitry X and the substrate contact adjacent thereto are connected together by a shared ground plane in the laminate substrate, and the ground supply connections for the other substrate contact and circuitry Y are each separate from the other ground supply connections. In FIG. 16(d), the ground supply connections for circuitry Y and the substrate contact adjacent thereto are connected together by a shared ground plane in the laminate substrate, and the ground supply connections for the other substrate contact and circuitry X are each separate from the other ground supply connections. In FIG. 16(e), the ground supply connections for circuitry X and the substrate contact adjacent thereto are connected together by a shared ground plane in the laminate substrate, and similarly the ground supply connections for circuitry Y and the substrate contact adjacent thereto are connected together by another shared ground plane in the laminate substrate. In FIG. 16(f), the ground supply connections for the two substrate contacts are connected together by a shared ground plane in the laminate substrate, and the ground supply connections for circuitry X and circuitry Y are each separate from the other ground supply connections. In FIG. 16(g), the ground supply connections for circuitry X and the two substrate contacts are connected together via a shared ground plane in the laminate substrate, and the ground supply connection for circuitry Y is separate therefrom. In FIG. 16(h), the ground supply connections for circuitry Y and the two substrate contacts are connected together by a shared ground plane in the laminate substrate, and the ground supply connection for circuitry X is separate therefrom.

Similar considerations may be made in respect of FIGS. 16(a) to 16(h) as are made above in respect of FIGS. 15(a) to 15(d). Accordingly, by analogy with FIGS. 4 and 9, it will be appreciated that the arrangement of FIG. 16(a) is preferable to the arrangement in FIG. 16(b), because the arrangement in FIG. 16(b) has substantial common impedance between the ground supply connections for circuitry X, circuitry Y and the two substrate contacts. In the arrangements of FIGS. 16(c) and 16(d), at least one of the substrate contacts has a ground supply connection which is separate from the other ground supply connections. Accordingly, those arrangements may be considered to provide at least reasonable noise isolation between circuitry X and circuitry Y (for example, in an equivalent manner to the arrangement of FIG. 15(a)). However, considering circuitry X to be noise-generating circuitry and circuitry Y to be noise-sensitive circuitry as before, in the arrangement of FIG. 16(c) the right-hand substrate contact may serve to "broadcast" or "dump" noise into the substrate of the flip chip (as in the arrangement of FIG. 15(c)). Similarly, it will be appreciated that the arrangement of FIG. 16(d) may serve to "pick up" noise from the substrate of the flip chip and "dump" that noise into the ground supply of circuitry Y. Accordingly, the arrangements of FIGS. 16(c) and 16(d) are less desirable than the arrangement of FIG. 16(a). By comparison with FIGS. 15(c) and 15(d), it will be appreciated that the arrangement of FIG. 16(e) provides the disadvantages of the arrangements of FIGS. 15(c) and 15(d) in combination. That is, the substrate contact in FIG. 16(e) connected to the ground supply for circuitry X may be considered to "efficiently" dump noise from circuitry X into the substrate of the flip chip, and the substrate contact connected to the ground supply of circuitry Y may be considered to similarly "efficiently" pick up noise from the substrate of the flip chip and dump that noise into the ground supply of circuitry Y. Accordingly, the arrangement of FIG. 16(e) may be considered to have poor noise performance. The arrangement of FIG. 16(f) may be considered to be essentially equivalent to the arrangement of FIG. 14(c). Accordingly, the arrangement of FIG. 16(f) may be considered to be undesirable because the shared ground plane acts to conduct noise from one of the substrate contacts to the other. The arrangements of FIGS. 16(g) and 16(h) may be seen to be generally equivalent to the arrangements of FIGS. 15(c) and 15(d), respectively. Accordingly, the arrangements of FIGS. 16(g) and 16(h) may be considered to be undesirable for the same reasons as set out above in respect of the arrangements of FIGS. 15(c) and 15(d).

FIGS. 17(a) and 17(b) are schematic diagrams for the purpose of understanding that certain types of circuitry may be provided in the isolation zone between circuitry X and circuitry Y. FIG. 17(a) may be considered to be equivalent to FIG. 8, in that a single substrate contact is provided between circuitry X and circuitry Y. FIG. 17(b) may be considered to be equivalent to FIG. 9, in that two substrate contacts are provided between circuitry X and circuitry Y. Each of FIGS. 17(a) and 17(b) accordingly represents a plan view of a flip chip in a similar manner to FIGS. 14(a) to 14(d).

Signals may generally be required to pass from circuitry X to circuitry Y, and from circuitry Y to circuitry X. Those signals may for example contain data or other information. Those signals may pass between circuitry X and circuitry Y along circuit paths provided in metal layers (not shown) of the flip chip situated between the base of the substrate and the ball grid array (not shown). Signal conveying, signal buffering and/or signal re-timing circuitry may be provided along those signal paths. In FIGS. 17(a) and 17(b) a signal path is shown from circuitry X to circuitry Y, and another signal path is shown from circuitry Y to circuitry X. Along those paths, buffer circuitry 1700 is shown provided along the path concerned before it crosses one of the substrate contacts. It is emphasised that FIGS. 17(a) and 17(b) are schematic. Although the substrate contacts appear to be narrow in those Figures, they are in reality substantially wide, so that the signal paths are mostly over one or both of the substrate contacts. That is, in reality the signals spend most of their time crossing the substrate contact or contacts, and therefore capacitance to the substrate contacts may be significant. As shown in FIGS. 17(a) and 17(b), it will be appreciated that ground supply connections 1702 for the buffer circuitry 1700 may therefore be made to the substrate contact that the signal being buffered is about to cross.

The buffer circuitry 1700 is separate from circuitry X and circuitry Y, and typically is provided with its own power supply. Accordingly, the substrate contact concerned may serve as a ground supply for the buffer circuitry 1700 without generating significant common impedance between circuitry X and circuitry Y in the same way as explained previously (i.e. so that noise currents are substantially retained in self-contained loops). It will further be appreciated that buffer circuitry 1700 could be provided on both sides of each substrate contact to provide two-stage buffering of signals.

The arrangement of FIG. 17(b) may further be considered as follows. The buffer circuitry 1700 provided between the two substrate walls may be considered to be a circuitry portion Z, the arrangement therefore having three circuitry portions (X, Y and Z) with two isolation zones forming the gaps between them, each such isolation zone having a single substrate contact. In this case, circuitry Z can use (depending on what circuitry Z is) either of the substrate contacts or both of them as a ground supply without creating common impedance between circuitry X and circuitry Y.

FIG. 18 is a schematic diagram for use in explaining how a flip-chip package according to the present invention may be configured to be adaptable with minimum redesign to support different circuits as circuitry X and circuitry Y from one chip to the next.

In FIG. 18, the outer boundary 1800 represents the outer boundary of a laminate substrate, circles 1802 represents a possible pattern of a ball grid array on the underside of the laminate substrate for connection to a PCB, dashed-boundary 1804 represents where the outer boundary of a flip chip might be once mounted on the laminate substrate, and dots 1806 and grid 1808 represent a possible connection pattern on the upper surface of the laminate substrate for connection to the flip chip via its ball grid array.

In the present case, the flip chip is assumed to be of the peripheral-bump type, and so the dots 1806 represent connections for power and I/O terminals of the flip chip. Grid 1808 represents the pattern of metal on the surface of the laminate substrate forming the upper face of a grounded boundary.

Accordingly, connections to the grounded boundary from the flip chip may be made in any pattern across the grid 1808, since one large grounded boundary is effectively provided. It will be appreciated that grid 1808 could alternatively be a solid plane of metal rather than a grid, however a grid is preferable from the point of view of good adhesion of the laminate substrate to underfill typically employed between a flip chip and its laminate substrate. The flexibility of locations of connections to the grounded boundary effectively allows the position and shape of a substrate "wall" to be different from one flip chip to the next, whilst retaining the same laminate substrate layout. A possible path of such connections is represented by crosses 1810 and so it can be seen that the substrate "wall" may take any route across the flip chip. It will be appreciated that such flexibility can be advantageous for flip chips under test, i.e. before the design is finalised, since a single design of laminate substrate can be used for many different test flip chips.

The above flexibility in location of a substrate "wall" assumes a single substrate wall is present, as in circuitry arrangement 800. With two or more substrate walls, for example in circuitry arrangement 900, separate grounded boundaries are required, effectively requiring separate grids (or planes) instead of single grid 1808. Accordingly, in those situations, it will be appreciated that the flexibility of substrate-wall location is lower than in the case of a single substrate wall.

Although the present embodiments focus on ground supply lines, this is because circuitry X and circuitry Y are assumed to have separate power supplies (VDD). The same considerations as made herein with respect to the ground supply networks therefore could be made with respect to the power supply networks if, for example, the ground supplies were (instead of the power supplies) separate from one another. For example, in emitter-coupled-logic (ECL) circuitry, signals are generally referred to the positive supply rather than to the negative supply. Thus, it will be appreciated that the considerations made above with respect to the ground supply networks may be considered to be made with reference to the signal-reference network or signal-reference plane.

Flip chips embodying the present invention may comprise the circuitry of a digital-to-analogue converter (DAC), with digital parts thereof forming circuitry X and analogue parts thereof forming circuitry Y. Furthermore, such flip chips may enable a wide range of different additional digital circuits to also form part of circuitry X providing input signals to the DAC, without re-design of the DAC being necessary from the point of view of noise performance, because the presence of the grounded substrate contacts 860, 961, 962 provide the necessary noise isolation.

The invention claimed is:

1. A circuit arrangement, comprising:
   a chip having at least first and second circuit portions spaced apart from one another;
   a substrate-contact boundary located between the first and second circuitry portions, the substrate-contact boundary having a width W1; and
   a ground plane having a via, the via having a width W5, wherein W1>W5;
   wherein the chip, a substrate and a printed-circuit board (PCB) are respectively electrically connected through the ground plane of the substrate;
   the substrate-contact boundary is electrically connected to the ground plane of the substrate;
   the first, second circuits and substrate-contact boundary are connected to the ground plane.

2. The circuit arrangement of claim 1, wherein the chip comprises a ball grid array, and a diameter of the ball grid array has a width W3, wherein W1>W5>W3.

3. The circuit arrangement of claim 1, wherein the substrate has a thickness T, and wherein W1>T.

4. The circuit arrangement of claim 3, preferably wherein W1≥2T, and more preferably W1≥4T.

5. The circuit arrangement of claim 1, wherein the substrate-contact boundary comprises two spaced-apart substrate-contact boundaries, the two substrate-contact boundaries having a respectively width W6.

6. The circuit arrangement of claim 5, wherein the two substrate-contact boundaries are spaced apart from one another by a space having a width W7.

7. The circuit arrangement of claim 6, wherein W7>W6.

* * * * *